(12) United States Patent
Kim et al.

(10) Patent No.: US 12,016,177 B2
(45) Date of Patent: Jun. 18, 2024

(54) SEMICONDUCTOR DEVICES, NONVOLATILE MEMORY DEVICES INCLUDING THE SAME, ELECTRONIC SYSTEMS INCLUDING THE SAME, AND METHODS FOR FABRICATING THE SAME

(71) Applicant: Samsung Electronics Co., Ltd., Suwon-si (KR)

(72) Inventors: Hak Seon Kim, Seoul (KR); Byung Joo Go, Hwaseong-si (KR); Sung Kweon Baek, Hwaseong-si (KR); Jae Hwa Seo, Seoul (KR); Chang Heon Lee, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 396 days.

(21) Appl. No.: 17/210,861

(22) Filed: Mar. 24, 2021

(65) Prior Publication Data

US 2022/0059558 A1 Feb. 24, 2022

(30) Foreign Application Priority Data

Aug. 19, 2020 (KR) ........................ 10-2020-0103707

(51) Int. Cl.
*H10B 41/27* (2023.01)
*G11C 5/06* (2006.01)
*H01L 29/06* (2006.01)
*H10B 43/27* (2023.01)

(52) U.S. Cl.
CPC ............... *H10B 41/27* (2023.02); *G11C 5/06* (2013.01); *H01L 29/0653* (2013.01); *H10B 43/27* (2023.02)

(58) Field of Classification Search
CPC ..... H10B 43/27; H10B 41/27; H01L 29/0653; H01L 27/088; H01L 29/792; H01L 21/765; H01L 21/823481; H01L 21/823878; H01L 21/823475

See application file for complete search history.

(56) References Cited

U.S. PATENT DOCUMENTS

| | | |
|---|---|---|
| 6,969,676 B2 | 11/2005 | Schwan et al. |
| 7,119,413 B2 | 10/2006 | Kutsukake et al. |
| 7,245,534 B2 | 7/2007 | Goda et al. |
| 7,830,715 B2 | 11/2010 | Taniwaki et al. |
| 8,674,480 B2 | 3/2014 | Chiu et al. |
| 8,853,777 B2 | 10/2014 | Shin |
| 8,994,121 B2 | 3/2015 | Kutsukake et al. |
| 9,312,015 B1 | 4/2016 | Hsiung et al. |
| 10,600,809 B2 | 3/2020 | Lee et al. |

(Continued)

FOREIGN PATENT DOCUMENTS

CN 104425344 A 3/2015

*Primary Examiner* — Mary A Wilczewski
*Assistant Examiner* — Adin Hrnjic
(74) *Attorney, Agent, or Firm* — Myers Bigel, P.A.

(57) ABSTRACT

A semiconductor device comprises a substrate; an element isolation film that defines a first active region in the substrate; a first gate electrode on the first active region; a first source/drain region located inside the first active region between the element isolation film and the first gate electrode; and an isolation contact that extends in a vertical direction intersecting an upper face of the substrate, in the element isolation film. The isolation contact is configured to have a voltage applied thereto.

17 Claims, 20 Drawing Sheets

(56) References Cited

U.S. PATENT DOCUMENTS

| | | | |
|---|---|---|---|
| 2008/0197446 A1* | 8/2008 | Disney | H01L 21/761 |
| | | | 257/E21.546 |
| 2010/0201440 A1 | 8/2010 | Nowak | |
| 2013/0285134 A1 | 10/2013 | Dornel | |
| 2015/0041893 A1* | 2/2015 | Wang | H01L 29/7816 |
| | | | 438/286 |
| 2017/0005121 A1* | 1/2017 | Lenchenkov | H01L 27/1464 |
| 2017/0194425 A1* | 7/2017 | Lee | H01L 29/0649 |
| 2019/0067124 A1 | 2/2019 | Tsai et al. | |
| 2020/0126867 A1 | 4/2020 | Zhou et al. | |
| 2021/0183770 A1* | 6/2021 | Kim | H01L 23/535 |

\* cited by examiner

SEMICONDUCTOR DEVICES, NONVOLATILE MEMORY DEVICES INCLUDING THE SAME, ELECTRONIC SYSTEMS INCLUDING THE SAME, AND METHODS FOR FABRICATING THE SAME

CROSS-REFERENCE TO RELATED APPLICATION

This application claims priority from Korean Patent Application No. 10-2020-0103707, filed on Aug. 19, 2020 in the Korean Intellectual Property Office, and all the benefits accruing therefrom under 35 U.S.C. 119, the entire contents of which are herein incorporated by reference.

BACKGROUND

1. Technical Field

The present disclosure relates to semiconductor devices. More specifically, the present disclosure relates to semiconductor devices including an element isolation film.

2. Description of the Related Art

With the tendency of electronic products to be light, thin, short and small, there is an increasing demand for high integration of semiconductor devices. Since the size of components included in the semiconductor devices (e.g., transistors) also decreases as semiconductor devices are gradually highly integrated, there may be a problem of an occurrence of leakage current. Therefore, it may be advantageous to control the leakage current of a semiconductor device to improve the performance and reliability of the semiconductor device.

On the other hand, there is a demand for a semiconductor device capable of storing a high capacity of data in an electronic system that uses data storage. Accordingly, a way which may increase the data storage capacity of the semiconductor device is being researched. For example, as one of various methods for increasing the data storage capacity of the semiconductor device, a semiconductor device that includes three-dimensionally arranged memory cells instead of two-dimensionally arranged memory cells has been proposed.

SUMMARY

Aspects of the present invention provide a semiconductor device in which leakage current is controlled to improve reliability and performance.

Aspects of the present invention also provide a nonvolatile memory device including a semiconductor device in which leakage current is controlled and reliability and performance are improved.

Aspects of the present invention also provide an electronic system including a semiconductor device in which leakage current is controlled and reliability and performance are improved.

Aspects of the present invention also provide a method for fabricating a semiconductor device in which leakage current is controlled and reliability and performance are improved.

According to an aspect of the present disclosure, a semiconductor device comprising a substrate; an element isolation film that defines a first active region in the substrate; a first gate electrode on the first active region; a first source/drain region located inside the first active region between the element isolation film and the first gate electrode; and an isolation contact that extends in a vertical direction intersecting an upper face of the substrate, in the element isolation film. The isolation contact is configured to have a voltage applied thereto.

According to another aspect of the present disclosure, a semiconductor device comprising a substrate including an element isolation trench that defines an active region; an element isolation film that includes an insulating liner extending along a profile of the element isolation trench, an etching blocking liner on the insulation liner, and a gap fill insulating film that is in the element isolation trench on the etching blocking liner; a gate electrode on the active region; a source/drain region in the active region between the element isolation film and the gate electrode; and an isolation contact in the element isolation film. The isolation contact extends in the gap fill insulating film in a vertical direction intersecting an upper face of the substrate and comes into contact with the etching blocking liner.

According to another aspect of the present disclosure, a nonvolatile memory device that includes a first substrate of a peripheral circuit region, and a second substrate of a cell region, the nonvolatile memory device comprising a first circuit element and a second circuit element on the first substrate; an element isolation film that separates the first circuit element and the second circuit element in the first substrate; an isolation contact that extends in a vertical direction intersecting an upper face of the first substrate, in the element isolation film; a plurality of word lines sequentially stacked on the second substrate; a channel structure that intersects the plurality of word lines, on the second substrate; and a bit line connected to the channel structure. The isolation contact is configured to have a voltage applied thereto.

However, aspects of the present invention are not restricted to the examples set forth herein. The above and other aspects of the present invention will become more apparent to one of ordinary skill in the art to which the present invention pertains by referencing the detailed description of the present invention given below.

BRIEF DESCRIPTION OF THE DRAWINGS

The above and other aspects and features of the present disclosure will become more apparent by describing in detail example embodiments thereof with reference to the attached drawings, in which.

DETAILED DESCRIPTION

Hereinafter, a semiconductor device according to some embodiments will be explained referring to FIGS. 1 to 8.

Figure 1:
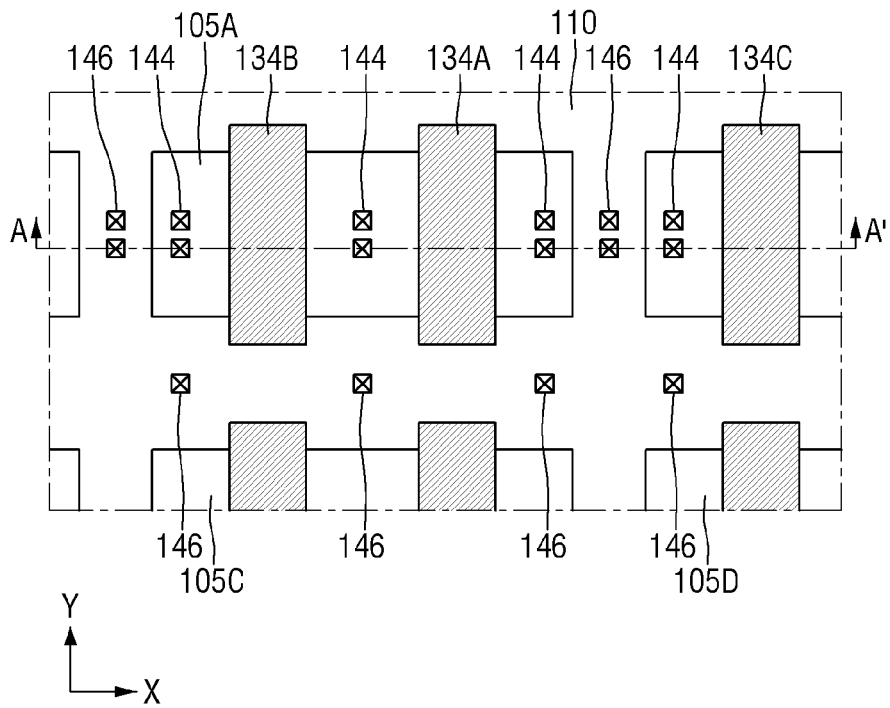
FIG. 1 is a layout diagram for explaining the semiconductor device according to some embodiments.
Figure 2:
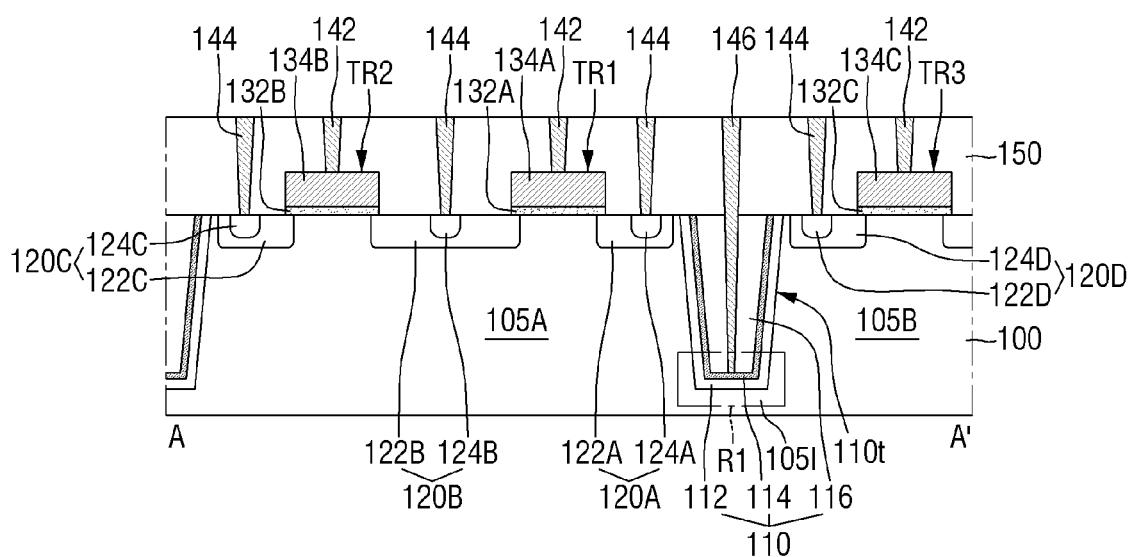
FIG. 2 is a schematic cross-sectional view taken along a line A-A' of FIG. 1.
Figure 3A:
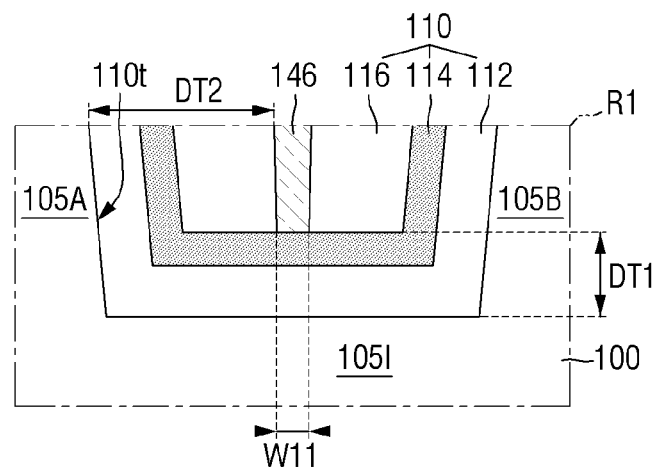
FIGS. 3a and 3b are various enlarged views of a region R1 of FIG. 2.
Figure 3B:
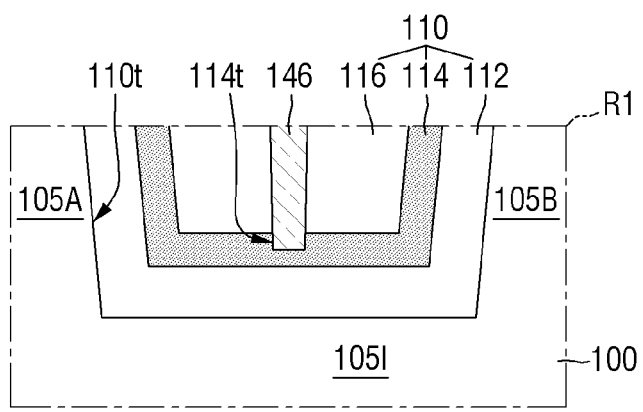

FIG. 1 is a layout diagram for explaining the semiconductor device according to some embodiments. FIG. 2 is a schematic cross-sectional view taken along a line A-A' of FIG. 1. FIGS. 3a and 3b are various enlarged views of a region R1 of FIG. 2.

Referring to FIGS. 1, 2, and 3a, the semiconductor device according to some embodiments may include a first substrate 100, an element isolation film 110, first to third circuit elements TR1, TR2 and TR3, an interlayer insulation film 150, a gate contact 142, a source/drain contact 144 and an isolation contact 146. For convenience of explanation, the gate contact 142 is now shown in FIG. 1.

The first substrate 100 may include, but is not limited to, a base substrate, and an epitaxial layer grown on the base substrate. For example, the first substrate 100 may include only the base substrate without the epitaxial layer. The first substrate 100 may be a silicon substrate, a gallium arsenide substrate, a silicon germanium substrate, a ceramic substrate, a quartz substrate, a display glass substrate or the like, and may be an SOI (Semiconductor On Insulator) substrate. Hereinafter, the first substrate 100 will be explained as a silicon substrate as an example.

In some embodiments, the first substrate 100 may be doped with a first conductive type. For example, when each of the first to third circuit elements TR1, TR2 and TR3 to be described later is an n-type transistor, the first substrate 100 may include p-type impurities. Although not shown, the first substrate 100 may also include wells doped with the first conductive type.

The element isolation film 110 may define a plurality of active regions 105A, 105B, 105C and 105D inside the first substrate 100. For example, an element isolation trench 110t defining a plurality of active regions 105A, 105B, 105C and 105D may be formed in the first substrate 100. The element isolation film 110 may be in (e.g., may fill) the element isolation trench 110t. The element isolation film 110 may surround each active region 105A, 105B, 105C and 105D. In some embodiments, a depth at which the element isolation trench 110t is formed may be about 3000 Angstroms (Å) to about 5000 Å.

The plurality of active regions 105A, 105B, 105C and 105D may be separated from each other by the element isolation film 110. For example, the plurality of active regions 105A, 105B, 105C and 105D may include a first active region 105A and a second active region 105B arranged along a first direction X. The element isolation film 110 between the first active region 105A and the second active region 105B extends in a second direction Y intersecting the first direction X, and may separate the first active region 105A and the second active region 105B. Additionally or alternatively, for example, the plurality of active regions 105A, 105B, 105C and 105D may include a third active region 105C arranged together with the first active region 105A along a second direction Y, and a fourth active region 105D arranged together with the second active region 105B along the second direction Y. The element isolation film 110 between the first active region 105A and the third active region 105C, and between the second active region 105B and the fourth active region 105D may extend in the first direction X, separate the first active region 105A and the third active region 105C, and separate the second active region 105B and the fourth active region 105D.

The element isolation film 110 may define an isolation region 105I in the first substrate 100 on a lower face of the element isolation film 110. That is, as shown in FIGS. 2 and 3a, the isolation region 105I may be a region of the first substrate 100 which is defined below the element isolation film 110 and overlaps the element isolation film 110 in the vertical direction. Here, the vertical direction means a direction that intersects the upper face of the first substrate 100. For example, the isolation region 105I may be defined in the first substrate 100 between the first active region 105A and the second active region 105B.

In FIGS. 2 and 3a, although the side face of the element isolation film 110 is shown to have an inclination, this is only a feature of the process of forming the element isolation film 110, and the present invention is not limited thereto.

In some embodiments, the element isolation film 110 may be formed of a multi-films. For example, the element isolation film 110 may include an insulating liner 112, an etching blocking liner 114 and a gap fill insulating film 116, which are sequentially stacked in the element isolation trench 110t. The insulating liner 112 may extend along the profiles of the side face and the lower face of the element isolation trench 110t in a conformal manner. The etching blocking liner 114 may be formed on the insulating liner 112. The etching blocking liner 114 may extend along the profile of the insulating liner 112 in a conformal manner. The gap fill insulating film 116 may be formed on the etching blocking liner 114. The gap fill insulating film 116 may be in (e.g., may fill) the region of the element isolation trench 110t that remains after the insulating liner 112 and the etching blocking liner 114 are formed.

The insulating liner 112, the etching blocking liner 114 and the gap fill insulating film 116 may include, for example, but are not limited to, at least one of silicon oxide, silicon nitride, silicon oxynitride, and a combination thereof.

In some embodiments, the etching blocking liner 114 may include a material having an etching selectivity relative to the insulating liner 112 and the gap fill insulating film 116. For example, when the insulating liner 112 and the gap fill insulating film 116 include silicon oxide, the etching blocking liner 114 may include at least one of silicon nitride, silicon carbonitride, silicon oxycarbonitride and a combination thereof. As an example, the insulating liner 112 and the gap fill insulating film 116 may include silicon oxide, and the etching blocking liner 114 may include silicon nitride.

The first to third circuit elements TR1, TR2 and TR3 may be placed on the active region 105A, 105B, 105C and 105D.

For example, the first circuit element TR1 and the second circuit element TR2 may be placed on the first active region 105A, and the third circuit element TR3 may be placed on the second active region 105B.

The first circuit element TR1 may include a first gate dielectric film 132A, a first gate electrode 134A, a first source/drain region 120A and a second source/drain region 120B. The first gate electrode 134A may extend in one direction (e.g., the second direction Y) on the first active region 105A. The first gate dielectric film 132A may be interposed between the first substrate 100 and the first gate electrode 134A. The first source/drain region 120A may be formed in the first active region 105A on one side of the first gate electrode 134A. The second source/drain region 120B may be formed in the first active region 105A on the other (e.g., an opposite) side of the first gate electrode 134A.

The first source/drain region 120A may be adjacent to the element isolation film 110. For example, the first source/drain region 120A may be formed in the first active region 105A between the first gate electrode 134A and the element isolation film 110.

In some embodiments, the first source/drain region 120A may be a drain region of the first circuit element TR1, and the second source/drain region 120B may be a source region of the first circuit element TR1. For example, when the first circuit element TR1 is an n-type transistor, a voltage relatively higher than that of the second source/drain region 120B may be applied to the first source/drain region 120A. As an example, a voltage of about 5 volts (V) may be applied to the first source/drain region 120A, and a voltage of 0 V may be applied to the second source/drain region 120B. In contrast, when the first circuit element TR1 is a p-type transistor, a voltage relatively lower than that of the second source/drain region 120B may be applied to the first source/drain region 120A.

The second circuit element TR2 may include a second gate dielectric film 132B, a second gate electrode 134B, a second source/drain region 120B and a third source/drain region 120C. The second gate electrode 134B may extend in one direction (e.g., the second direction Y) on the first active region 105A. As an example, the second gate electrode 134B may extend alongside (e.g., in parallel with) the first gate electrode 134A. The second gate dielectric film 132B may be interposed between the first substrate 100 and the second gate electrode 134B. The second source/drain region 120B may be formed in the first active region 105A on one side of the second gate electrode 134B. The third source/drain region 120C may be formed in the first active region 105A on the other (e.g., an opposite) side of the second gate electrode 134B.

In some embodiments, the first circuit element TR1 and the second circuit element TR2 may share a second source/drain region 120B. For example, the second source/drain region 120B may be formed in the first active region 105A between the first gate electrode 134A and the second gate electrode 134B.

The third source/drain region 120C may be adjacent to the element isolation film 110. For example, the third source/drain region 120C may be formed in the first active region 105A between the second gate electrode 134B and the element isolation film 110.

In some embodiments, the second source/drain region 120B may be a source region of the second circuit element TR2, and the third source/drain region 120C may be a drain region of the second circuit element TR2. For example, when the second circuit element TR2 is an n-type transistor, a voltage relatively higher than that of the second source/drain region 120B may be applied to the third source/drain region 120C. As an example, a voltage of about 5 V may be applied to the third source/drain region 120C, and a voltage of 0 V may be applied to the second source/drain region 120B. In contrast, when the second circuit element TR2 is a p-type transistor, a voltage relatively lower than that of the second source/drain region 120B may be applied to the third source/drain region 120C.

The third circuit element TR3 may include a third gate dielectric film 132C, a third gate electrode 134C and a fourth source/drain region 120D. The third gate electrode 134C may extend in one direction (e.g., the second direction Y) on the second active region 105B. As an example, the third gate electrode 134C may extend alongside (e.g., in parallel with) the first gate electrode 134A and the second gate electrode 134B. The third gate dielectric film 132C may be interposed between the first substrate 100 and the third gate electrode 134C. The fourth source/drain region 120D may be formed in the second active region 105B on one side of the third gate electrode 134C.

The fourth source/drain region 120D may be adjacent to the element isolation film 110. For example, the fourth source/drain region 120D may be formed in the second active region 105B between the third gate electrode 134C and the element isolation film 110. In some embodiments, the fourth source/drain region 120D may be a drain region of the third circuit element TR3.

The first to third gate dielectric films 132A, 132B and 132C may include, for example, but are not limited to, silicon oxide, silicon oxynitride, silicon nitride, and a high-k material having a higher dielectric constant than silicon oxide. The high-k material may include, for example, but is not limited to, at least one of hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, lead zinc niobate, and combinations thereof.

In some embodiments, the first to third circuit elements TR1, TR2 and TR3 may be high-voltage transistors. For example, the first to third circuit elements TR1, TR2 and TR3 may each include, but are not limited to, thick first to third gate dielectric films 132A, 132B and 132C of about 200 Å or more.

The first to third gate electrodes 134A, 134B and 134C may include, for example, but are not limited to, at least one of polycrystalline silicon (poly Si), amorphous silicon (a-Si), titanium (Ti), titanium nitride (TiN), tungsten nitride (WN), titanium aluminum (TiAl), titanium aluminum nitride (TiAlN), tantalum nitride (TaN), titanium carbide (TiC), tantalum carbide (TaC), tantalum carbonitride (TaCN), tantalum silicon nitride (TaSiN), tantalum (Ta), cobalt (Co), ruthenium (Ru), aluminum (Al), tungsten (W) and combinations thereof.

In some embodiments, the first to third circuit elements TR1, TR2 and TR3 may be high-voltage transistors. For example, although a high voltage of about 5 V to about 100 V may be applied to the first to third gate electrodes 134A, 134B and 134C, the present invention is not limited thereto.

The first to fourth source/drain regions 120A, 120B, 120C and 120D may be doped with a second conductive type different from the first conductive type, respectively. For example, the first to fourth source/drain regions 120A, 120B, 120C and 120D may each include n-type impurities.

In some embodiments, the first to fourth source/drain regions 120A, 120B, 120C and 120D may each include low-concentration impurity regions 122A, 122B, 122C and 122D and high-concentration impurity regions 124A, 124B, 124C and 124D. The high-concentration impurity regions 124A, 124B, 124C and 124D may be formed inside the low-concentration impurity regions 122A, 122B, 122C and 122D. The low-concentration impurity regions 122A, 122B, 122C and 122D may surround the high-concentration impurity regions 124A, 124B, 124C and 124D.

The low-concentration impurity regions 122A, 122B, 122C and 122D and the high-concentration impurity regions 124A, 124B, 124C and 124D may be doped with the second conductive type, respectively. At this time, the doping concentration of the high-concentration impurity regions 124A, 124B, 124C and 124D may be higher than the doping concentration of the low-concentration impurity regions 122A, 122B, 122C and 122D.

Although not shown, the first to third circuit elements TR1, TR2 and TR3 may further include a gate spacer which covers the side faces of the first to third gate electrodes 134A, 134B and 134C, respectively. Further, although not shown, the first to third circuit elements TR1, TR2 and TR3 may further include a gate capping pattern which covers the upper faces of the first to third gate electrodes 134A, 134B and 134C, respectively. Although not shown, the first to third circuit elements TR1, TR2 and TR3 may further include an etching blocking film which covers first to fourth source/drain regions 120A, 120B, 120C and 120D, the gate spacer, and the gate capping pattern.

The interlayer insulating film 150 may be formed on the first substrate 100. The interlayer insulating film 150 may be on (e.g., may cover) the first substrate 100, the element isolation film 110, and the first to third circuit elements TR1, TR2 and TR3.

The interlayer insulating film 150 may include, for example, at least one of silicon oxide, silicon nitride, silicon oxynitride and a low-k material having a lower dielectric constant than silicon oxide. The low-k material may include, for example, but is not limited to, at least one of FOX (Flowable Oxide), TOSZ (Torene SilaZene), USG (Undoped Silica Glass), BSG (Borosilica Glass), PSG (PhosphoSilica Glass), BPSG (BoroPhosphoSilica Glass), PETEOS (Plasma Enhanced Tetra Ethyl Ortho Silicate), FSG (Fluoride Silicate Glass), CDO (Carbon Doped silicon Oxide), Xerogel, Aerogel, Amorphous Fluorinated Carbon, OSG (Organo Silicate Glass), Parylene, BCB (bis-benzocyclobutenes), SiLK, polyimide, porous polymeric material and combinations thereof.

In some embodiments, the first to third circuit elements TR1, TR2 and TR3 may be formed at the same level. As used herein, "same level" means that the circuit elements are formed by the same fabricating process.

The gate contact 142 may be connected to each of the first to third gate electrodes 134A, 134B and 134C. For example, the gate contact 142 may extend in the vertical direction intersecting the upper face of the first substrate 100 and penetrate the interlayer insulating film 150. The gate contacts 142 may be electrically connected to the respective first to third gate electrodes 134A, 134B and 134C to apply voltage to the respective first to third gate electrodes 134A, 134B and 134C.

The gate contact 142 may include, but is not limited to, metals such as, for example, aluminum (Al), copper (Cu) or tungsten (W).

The source/drain contact 144 may be connected to the respective first to fourth source/drain regions 120A, 120B, 120C and 120D. For example, the source/drain contact 144 may vertically extend and penetrate the interlayer insulating film 150. The source/drain contact 144 may be electrically connected to the respective first to fourth source/drain regions 120A, 120B, 120C and 120D to apply the voltage to the respective first to fourth source/drain regions 120A, 120B, 120C and 120D.

The source/drain contact 144 may include, for example, but is not limited to, metals such as aluminum (Al), copper (Cu) or tungsten (W). In some embodiments, the gate contact 142 and the source/drain contact 144 may be formed at the same level. For example, the gate contact 142 and the source/drain contact 144 may include the same material.

The isolation contact 146 may be placed on the element isolation film 110. The isolation contact 146 may vertically overlap the element isolation film 110. Further, at least a part of the isolation contact 146 may be placed in the element isolation film 110. For example, the isolation contact 146 may vertically extend, penetrate the interlayer insulating film 150 and extend to the inside of the element isolation film 110.

In some embodiments, a plurality of isolation contacts 146 may be placed around each of the plurality of active regions 105A, 105B, 105C and 105D. For example, as shown in FIG. 1, some of the plurality of isolation contacts 146 may be interposed between the first active region 105A and the second active region 105B. Also, some others of the plurality of isolation contacts 146 may be interposed between the first active region 105A and the third active region 105C. The number and arrangement of the isolation contacts 146 shown in FIG. 1 are only examples, and the present invention is not limited thereto.

In some embodiments, the isolation contacts 146 interposed between the first active region 105A and the second active region 105B may be arranged (e.g., aligned with each other) along the second direction Y, and the isolation contacts 146 interposed between the first active region 105A and the third active region 105C may be arranged (e.g., aligned with each other) along the first direction X.

In some embodiments, the isolation contact 146 may be spaced apart from the lower face of the element isolation film 110. For example, as shown in FIG. 3a, the lower face of the isolation contact 146 may be spaced apart from the lower face of the element isolation film 110 by DT1. In some embodiments, a spaced distance DT1 of the isolation contact 146 from the lower face of the element isolation film 110 may be about 100 Å to about 4000 Å. Accordingly, the lower face of the isolation contact 146 may contact the element isolation film 110, and the isolation contact 146 thus may not penetrate the lower face of the element isolation film 110.

In some embodiments, the isolation contact 146 may penetrate the gap fill insulating film 116 and come into contact with the etching blocking liner 114. For example, the lower face of the isolation contact 146 may come into contact with the upper face of the etching blocking liner 114 extending along the lower face of the element isolation trench 110t. The etching blocking liner 114 may be used as an etching blocking film in the etching process of forming a contact hole (e.g., the third contact hole 146t of FIG. 20) to form the isolation contact 146.

In some embodiments, the isolation contact 146 may not completely penetrate the etching blocking liner 114. For example, the lower face of the isolation contact 146 may be spaced apart from the lower face of the element isolation film 110 by the insulating liner 112 and the etching blocking liner 114. As an example, the spaced distance DT1 of the isolation contact 146 from the lower face of the element isolation film 110 may be the sum of the thickness of the insulating liner 112 and the thickness of the etching blocking liner 114.

In some embodiments, a width W11 of the isolation contact 146 may be smaller than a width of the element isolation film 110. In such a case, the isolation contact 146 may be spaced apart from the side face of the element isolation film 110. In some embodiments, the width W11 of the isolation contact 146 may be smaller than the width of the gap fill insulating film 116. In such a case, the isolation contact 146 may be spaced apart from the side face of the etching blocking liner 114.

A voltage may be applied to the isolation contact 146. The voltage applied to the isolation contact 146 may form an electric field in the isolation region 105I to form a potential barrier. When the isolation contact 146 is spaced apart from the lower face of the element isolation film 110, the insulating liner 112 and/or the etching blocking liner 114 may function as a dielectric film.

For example, when the first circuit element TR1 is an n-type transistor, the first source/drain region 120A including n-type impurities may function as a drain region of the first circuit element TR1. At this time, a ground voltage or a negative (−) voltage may be applied to the isolation contact 146. As an example, a voltage of 0 V to about −5 V may be applied to the isolation contact 146. As a result, the leakage current generated from the first source/drain region 120A toward the isolation region 105I may be reduced. In contrast, when the first circuit element TR1 is a p-type transistor, the first source/drain region 120A including p-type impurities may function as the drain region of the first circuit element TR1. At this time, a ground voltage or a positive (+) voltage may be applied to the isolation contact 146.

In some embodiments, the spaced distance DT1 of the isolation contact 146 from the lower face of the element isolation film 110 may be smaller than a spaced distance DT2 of the isolation contact 146 from the side face of the element isolation film 110. In such a case, the electric field formed on the lower face (the isolation region 105I) of the element isolation film 110 may be stronger than the electric field formed on the side face of the element isolation film 110.

The isolation contact 146 may include, for example, but is not limited to, metals such as aluminum (Al), copper (Cu) or tungsten (W). In some embodiments, the isolation contact 146 may be formed at the same level as the gate contact 142 and the source/drain contact 144. For example, the gate contact 142, the source/drain contact 144 and the isolation contact 146 may include the same material.

Referring to FIGS. 1, 2 and 3b, in the semiconductor device according to some embodiments, at least a part of the isolation contact 146 may be placed inside (e.g., by penetrating an upper surface of) the etching blocking liner 114.

For example, a part of the etching blocking liner 114 extending along the lower face of the element isolation trench 110t may include a first trench 114t extending from its upper face. The lower part of the isolation contact 146 may be formed inside the first trench 114t. This allows the lower face of the isolation contact 146 to be formed lower than the upper face of the etching blocking liner 114 extending along the lower face of the element isolation trench 110t. Unlike the example shown, in some embodiments, the isolation contact 146 may completely penetrate (i.e., penetrate both upper and lower surfaces of) the etching blocking liner 114.

Figure 4:
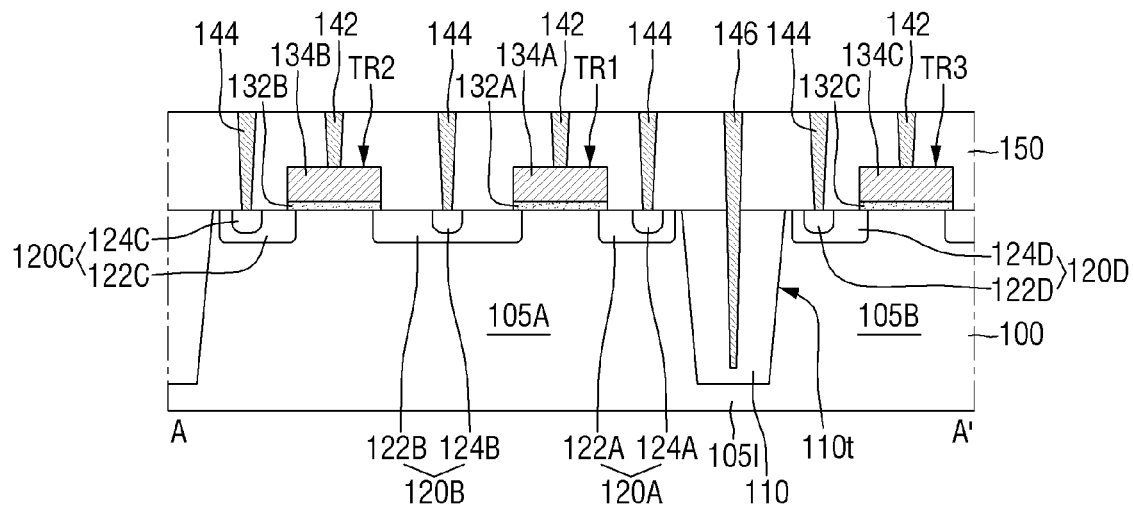
FIG. 4 is a cross-sectional view for explaining the semiconductor device according to some embodiments.

FIG. 4 is a cross-sectional view for explaining the semiconductor device according to some embodiments. For convenience of explanation, repeated parts of contents explained above using FIGS. 1 to 3b will be briefly explained or omitted.

Referring to FIG. 4, in the semiconductor device according to some embodiments, the element isolation film 110 may be formed of a single film.

For example, the element isolation film 110 may not include the insulating liner 112, the etching blocking liner 114 and the gap fill insulating film 116 of FIG. 2. In some embodiments, the isolation contact 146 may be spaced apart from the lower face of the element isolation film 110.

Figure 5:
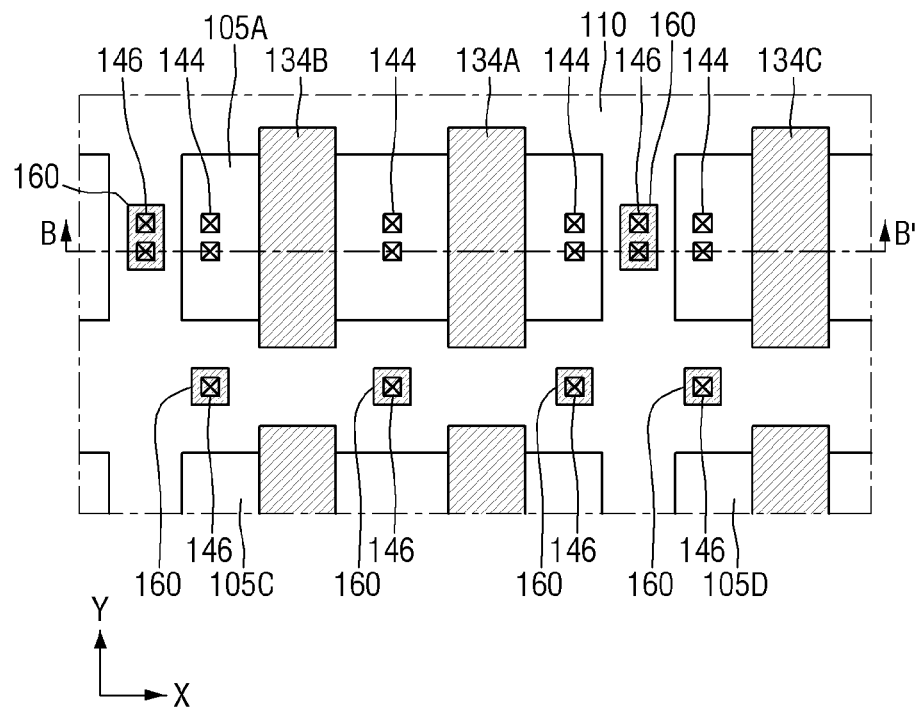
FIG. 5 is a layout diagram for explaining the semiconductor device according to some embodiments.
Figure 6:
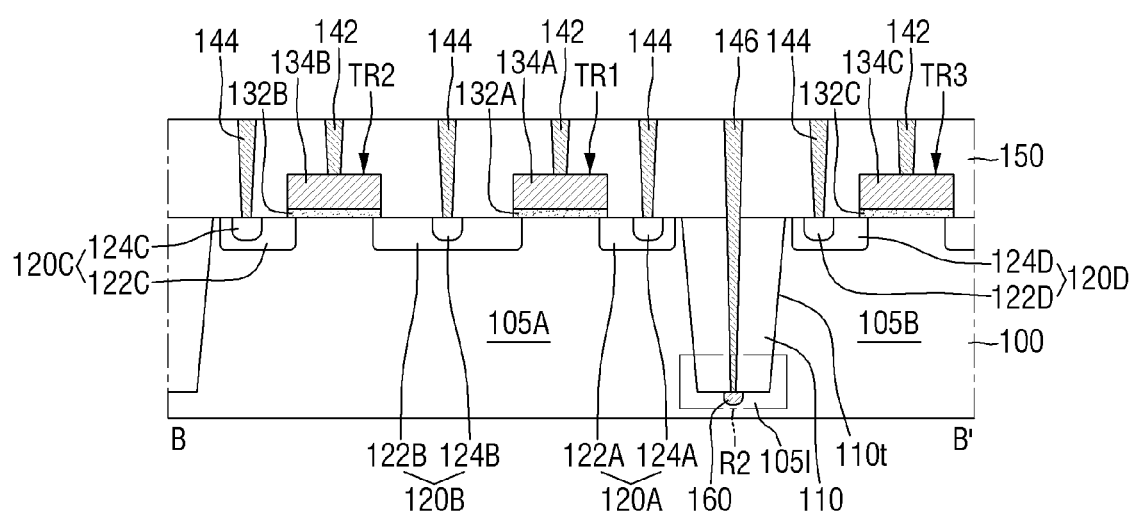
FIG. 6 is a schematic cross-sectional view taken along a line B-B' of FIG. 5.
Figure 7A:
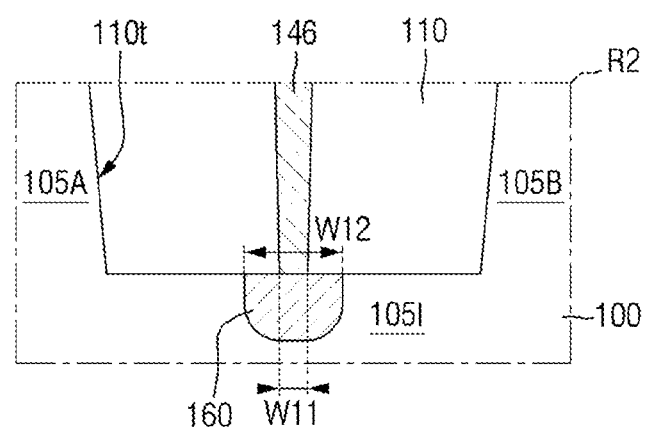
FIGS. 7a and 7b are various enlarged views of a region R2 of FIG. 6.
Figure 7B:
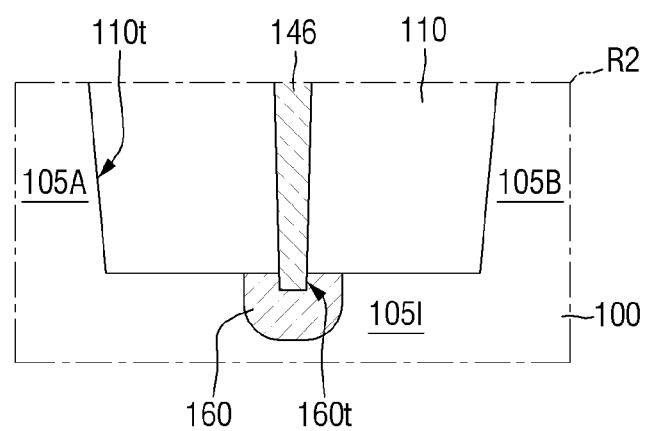

FIG. 5 is a layout diagram for explaining the semiconductor device according to some embodiments. FIG. 6 is a schematic cross-sectional view taken along a line B-B' of FIG. 5. FIGS. 7a and 7b are various enlarged views of a region R2 of FIG. 6. For convenience of explanation, repeated parts of contents explained above using FIGS. 1 to 4 will be briefly explained or omitted.

Referring to FIGS. 5 to 7a, in the semiconductor device according to some embodiments, the isolation contact 146 may come into contact with the isolation region 105I.

For example, the isolation contact 146 may extend in the vertical direction intersecting the upper face of the first substrate 100 and penetrate the interlayer insulating film 150 and the element isolation film 110.

In some embodiments, a contact impurity region 160 may be formed inside the isolation region 105I. The contact impurity region 160 may be doped with the first conductive type. For example, the contact impurity region 160 may include p-type impurities.

The isolation contact 146 may be placed on the contact impurity region 160. The isolation contact 146 may vertically overlap the contact impurity region 160. The isolation contact 146 may penetrate the element isolation film 110 and come into contact with the contact impurity region 160. The isolation contact 146 may come into contact with the contact impurity region 160 and apply a voltage to the isolation region 105I.

For example, when the first circuit element TR1 is an n-type transistor, the first source/drain region 120A including n-type impurities may function as the drain region of the first circuit element TR1. At this time, a ground voltage or a negative (−) voltage may be applied to the contact impurity region 160 by the isolation contact 146. As an example, a voltage of 0 V to about −5 V may be applied to the isolation contact 146. As a result, the leakage current generated from the first source/drain region 120A toward the isolation region 105I may be reduced. In contrast, when the first circuit element TR1 is a p-type transistor, the first source/drain region 120A including p-type impurities may function as the drain region of the first circuit element TR1. At this time, a ground voltage or a positive voltage (+) may be applied to the contact impurity region 160 by the isolation contact 146.

In some embodiments, the contact impurity region 160 may form an ohmic contact with the isolation contact 146. As long as the contact impurity region 160 forms ohmic contact with the isolation contact 146, the doping concentration of the contact impurity region 160 may be relatively low.

In some embodiments, the contact impurity region 160 may form a plurality of isolation regions spaced apart from each other. For example, each contact impurity region 160 may surround the isolation contact 146 from a planar view point. As an example, as shown in FIG. 5, each contact impurity region 160 may surround one or more isolation contacts 146.

In some embodiments, a width W12 of the contact impurity region 160 may be greater than the width W11 of the isolation contact 146, as shown in FIG. 7a. As a result, in the process of forming the isolation contact 146, the isolation contact 146 may stably come into contact with the contact impurity region 160.

Referring to FIGS. 5, 6 and 7b, in the semiconductor device according to some embodiments, at least a part of the isolation contact 146 may be placed inside (e.g., by penetrating an upper surface of) the contact impurity region 160.

For example, the contact impurity region 160 may include a second trench 160t extending from its upper face. The lower part of the isolation contact 146 may be formed inside the second trench 160t. As a result, the lower face of the isolation contact 146 may be formed lower than the upper face of the contact impurity region 160.

Figure 8:
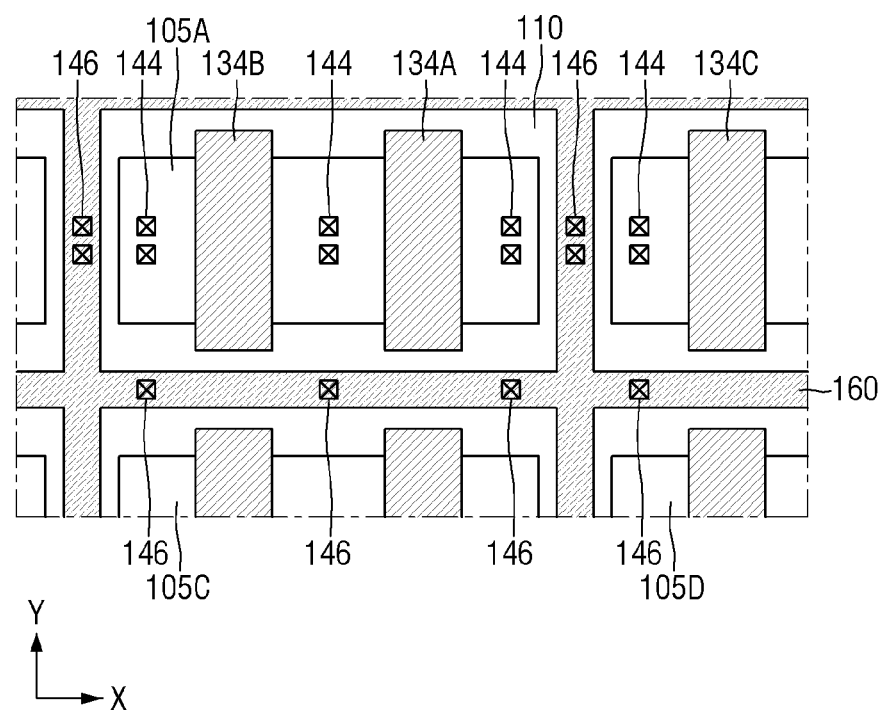
FIG. 8 is a layout diagram for explaining the semiconductor device according to some embodiments.

FIG. 8 is a layout diagram for explaining the semiconductor device according to some embodiments. For convenience of explanation, repeated parts of contents explained above using FIGS. 5 to 7b will be briefly explained or omitted.

Referring to FIG. 8, in the semiconductor device according to some embodiments, the contact impurity region 160 may surround each of the active regions 105A, 105B, 105C and 105D.

For example, a part of the contact impurity region 160 may extend in the second direction Y between the first active region 105A and the second active region 105B. Another part of the contact impurity region 160 may extend in the first direction X between the first active region 105A and the third active region 105C.

As the semiconductor devices are gradually highly integrated, the effects of leakage currents are gradually increasing. For example, as the width of the element isolation film gradually decreases, the leakage current (hereinafter, referred to as isolation leakage current) generated from the transistor adjacent to the element isolation film along the surface of the element isolation film may increase.

In order to prevent/impede this problem, although a high-concentration impurity region may be formed on the lower face of the element isolation film to form a potential barrier, there is a problem of a decrease in breakdown voltage of the transistor adjacent to the element isolation film. For example, when the first source/drain region 120A includes impurities of the second conductive type (e.g., an n-type), impurities of the first conductive type (e.g., a p-type) may be doped in the isolation region 105I at high concentration to form a potential barrier. However, the impurities of the first conductive type (e.g., the p-type) formed in the isolation region 105I may be diffused toward the first source/drain region 120A to lower the breakdown voltage of the first circuit element TR1.

In contrast, the semiconductor device according to some embodiments may control the isolation leakage current by not forming an impurity region in the isolation region 105I, or by simply forming a low-concentration impurity region. Specifically, the semiconductor device according to some embodiments may form a potential barrier in the isolation region 105I through the isolation contact 146 which is formed in the element isolation film 110 and to which a voltage is applied. This makes it possible to provide a semiconductor device in which the leakage current is effectively controlled and the reliability and performance are improved.

The nonvolatile memory devices according to some embodiments will be explained below referring to FIGS. 1 to 13.

Figure 9:
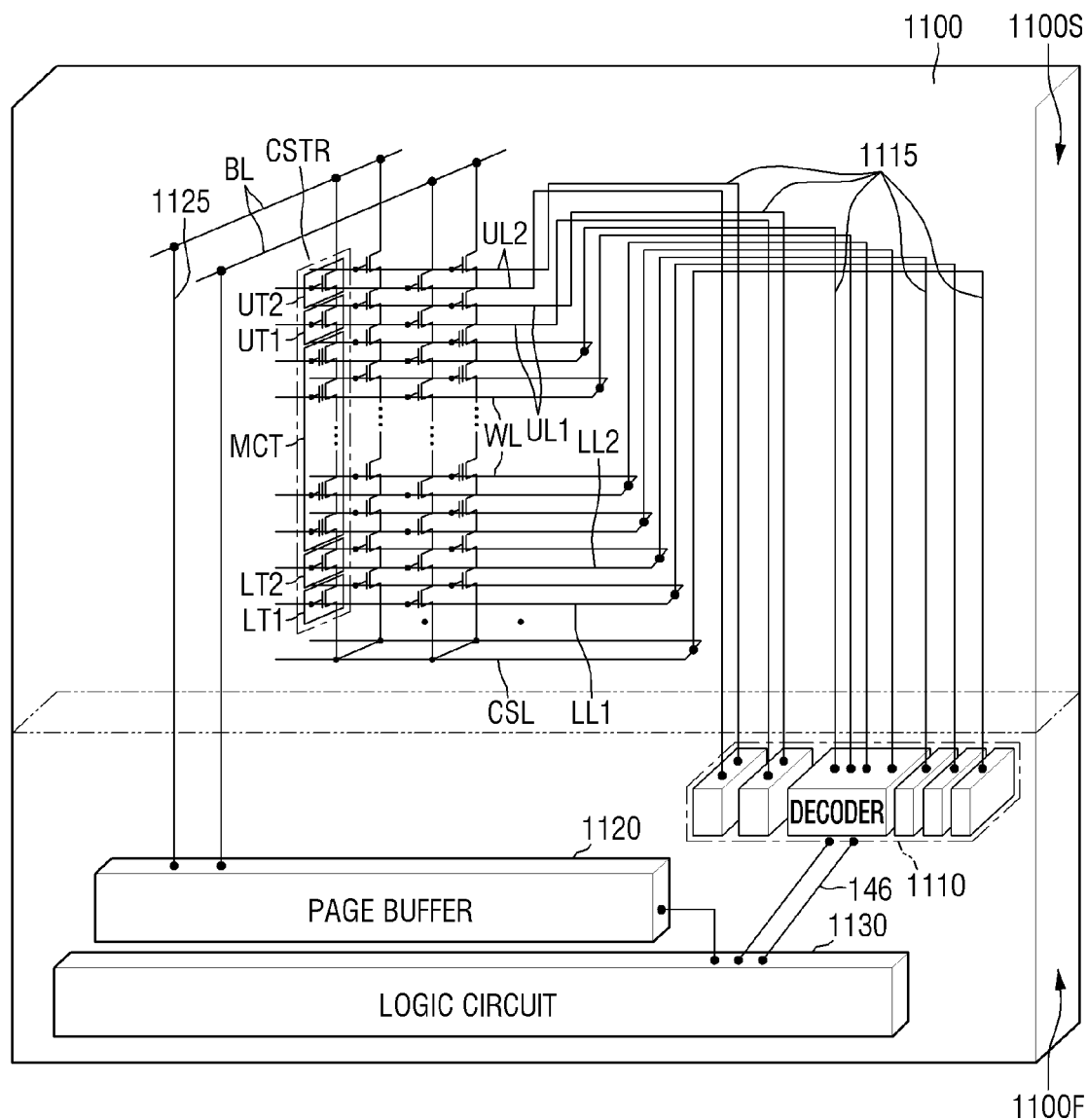
FIG. 9 is a schematic block diagram for explaining the nonvolatile memory device according to some embodiments.
Figure 10:
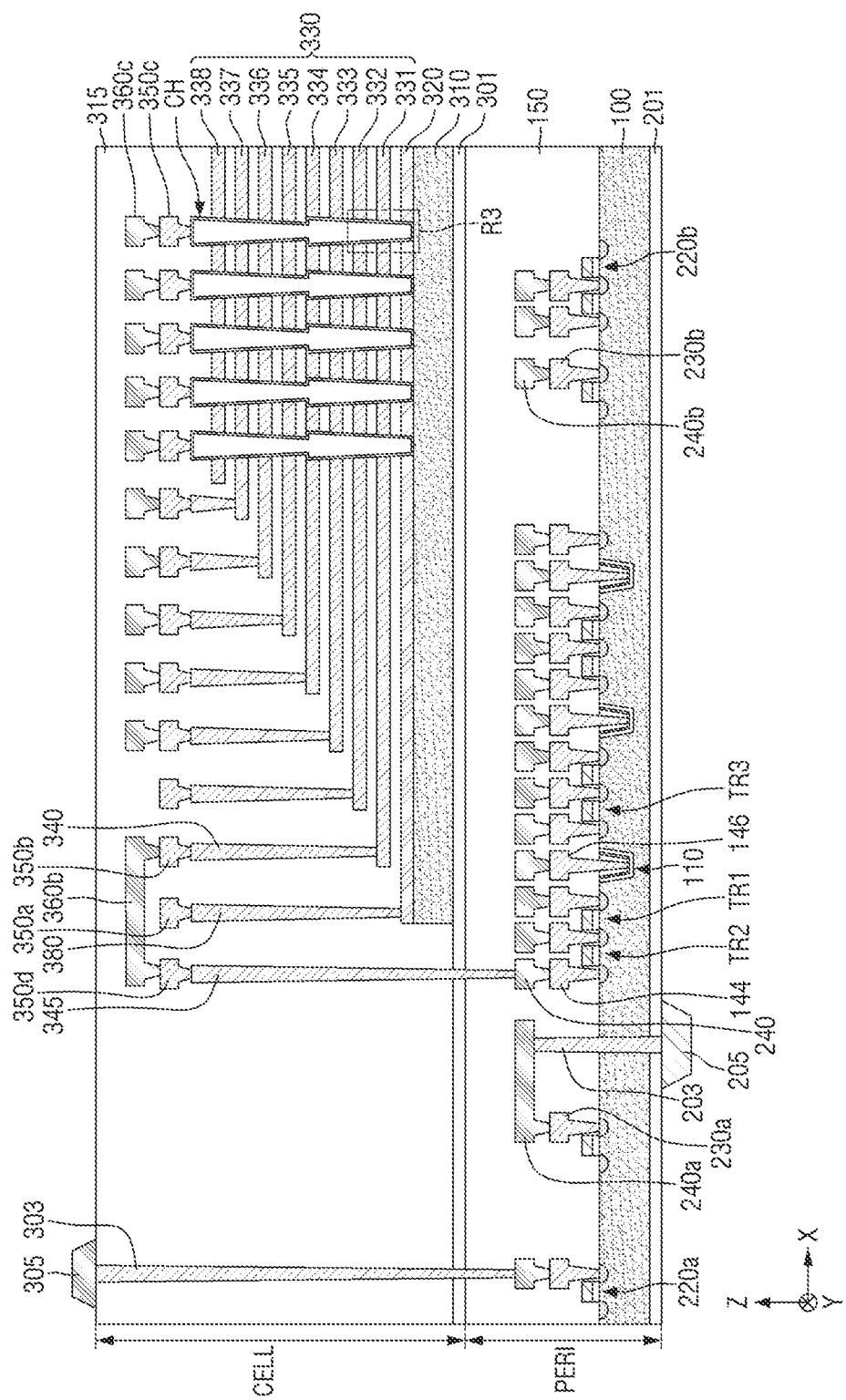
FIG. 10 is a schematic cross-sectional view for explaining the nonvolatile memory device according to some embodiments.
Figure 11:
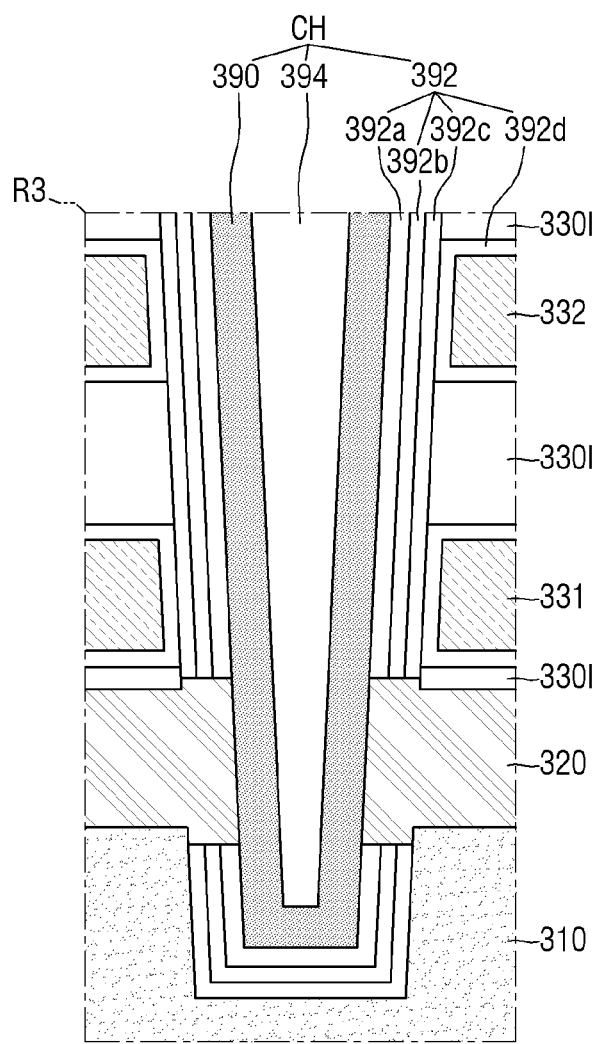
FIGS. 11 and 12 are various enlarged views of a region R3 of FIG. 10.
Figure 12:
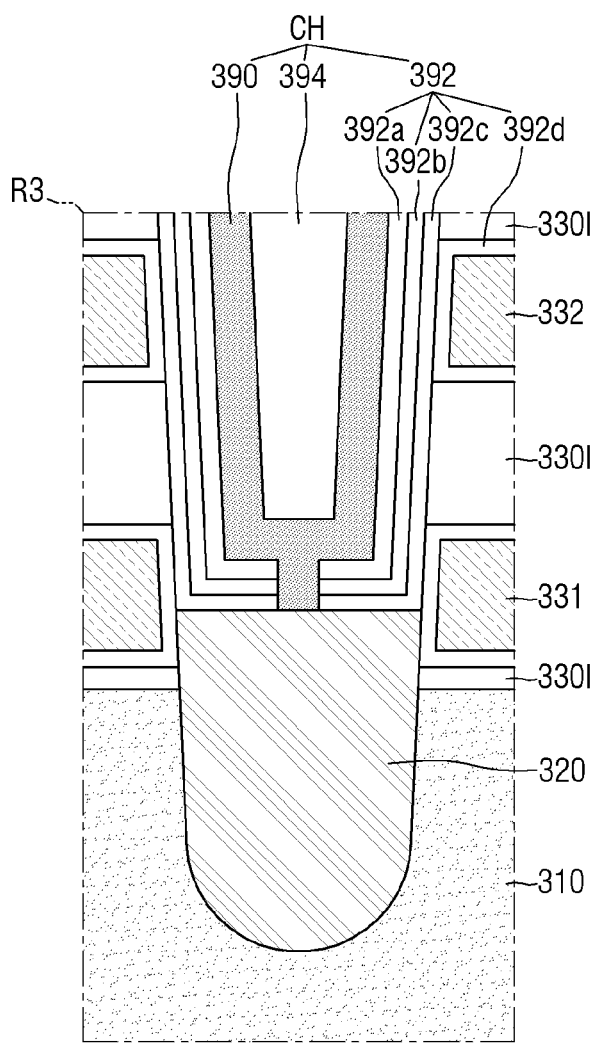

FIG. 9 is a schematic block diagram for explaining the nonvolatile memory device according to some embodiments. FIG. 10 is a schematic cross-sectional view for explaining the nonvolatile memory device according to some embodiments. FIGS. 11 and 12 are various enlarged views of a region R3 of FIG. 10. For convenience of explanation, repeated parts of contents explained above using FIGS. 1 to 8 will be briefly explained or omitted.

Referring to FIG. 9, the nonvolatile memory device 1100 according to some embodiments may include a first structure 1100F, and a second structure 1100S on the first structure 1100F.

In some embodiments, the first structure 1100F may be placed next to the second structure 1100S. The first structure 1100F may be a peripheral circuit structure including a decoder circuit 1110, a page buffer 1120, and a logic circuit 1130. The second structure 1100S may be a memory cell structure that includes a bit line BL, a common source line CSL, word lines WL, first and second gate upper lines UL1 and UL2, first and second gate lower lines LL1 and LL2, and memory cell strings CSTR between the bit line BL and the common source line CSL.

In the second structure 1100S, each memory cell string CSTR may include lower transistors LT1 and LT2 adjacent to the common source line CSL, upper transistors UT1 and UT2 adjacent to the bit line BL, and a plurality of memory cell transistors MCT placed between the lower transistors LT1 and LT2 and the upper transistors UT1 and UT2. The number of lower transistors LT1 and LT2 and the number of upper transistors UT1 and UT2 may be variously modified according to the embodiments.

In some embodiments, the upper transistors UT1 and UT2 may include a string selection transistor, and the lower transistors LT1 and LT2 may include a ground selection transistor. The first and second gate lower lines LL1 and LL2 may be gate electrodes of the lower transistors LT1 and LT2, respectively. The word lines WL may be the gate electrodes of the memory cell transistors MCT, and the first and second gate upper lines UL1 and UL2 may be the gate electrodes of the upper transistors UT1 and UT2, respectively.

In some embodiments, the lower transistors LT1 and LT2 may include a lower erase control transistor LT1 and a ground selection transistor LT2 connected in series. The upper transistors UT1 and UT2 may include a string selection transistor UT1 and an upper erase control transistor UT2 connected in series. At least one of the lower erase control transistor LT1 and the upper erase control transistor UT2 may be used in an erase operation for erasing the data stored in the memory cell transistors MCT, using a gate induced drain leakage (GIDL) phenomenon.

The common source line CSL, the first and second gate lower lines LL1 and LL2, the word lines WL, and the first and second gate upper lines UL1 and UL2 may be electrically connected to the decoder circuit 1110 through first connection wirings 1115 that extend from the inside of the first structure 1100F to the second structure 1100S. The bit lines BL may be electrically connected to the page buffer 1120 through second connection wirings 1125 that extend from the inside of the first structure 1100F to the second structure 1100S.

In the first structure 1100F, the decoder circuit 1110 and the page buffer 1120 may perform a control operation on at least one selected memory cell transistor among a plurality of memory cell transistors MCT. The decoder circuit 1110 and the page buffer 1120 may be controlled by the logic circuit 1130. In some embodiments, the logic circuit 1130 may be connected to the decoder circuit 1110 through the isolation contact 146. Accordingly, the logic circuit 1130 may control the element isolation film (e.g., film 110). For example, the logic circuit 1130 may apply a voltage to the isolation region (e.g., region 105I of FIG. 2) of the decoder circuit 1110.

Referring to FIG. 10, the nonvolatile memory device according to some embodiments may include a peripheral circuit region PERI and a cell region CELL.

The peripheral circuit region PERI may include a first substrate 100, an interlayer insulating film 150, a plurality of circuit elements TR1, TR2 TR3, 220*a* and 220*b* formed on the first substrate 100, first metal layers 144, 146, 230*a* and 230*b* connected to each of the plurality of circuit elements TR1, TR2, TR3, 220*a* and 220*b*, and second metal layers 240, 240*a* and 240*b* formed on the first metal layers 144, 146, 230*a* and 230*b*.

In some embodiments, the first to third circuit elements TR1, TR2 and TR3 may provide a decoder circuit (e.g., decoder circuit 1110 of FIG. 9) in the peripheral circuit region PERI. In some embodiments, the fourth circuit element 220*a* may provide a logic circuit (e.g., logic circuit 1130 of FIG. 9) in the peripheral circuit region PERI. In some embodiments, a fifth circuit element 220*b* may provide a page buffer (e.g., page buffer 1120 of FIG. 9) in the peripheral circuit region PERI.

Although only the first metal layers 144, 146, 230*a* and 230*b* and the second metal layers 240, 240*a* and 240*b* are shown and explained in the present specification, the present invention is not limited thereto, and at least one or more metal layers may be further formed on the second metal layers 240, 240*a* and 240*b*. At least some of one or more metal layers formed on the second metal layers 240, 240*a* and 240*b* may be formed of aluminum or the like having a lower resistance than copper which forms the second metal layers 240, 240*a* and 240*b*.

In some embodiments, the first metal layers 144, 146, 230*a* and 230*b* may be formed of tungsten having a relatively high resistance, and the second metal layers 240, 240*a* and 240*b* may be formed of copper having a relatively low resistance.

The interlayer insulating film 150 may be placed on the first substrate 100 to cover the plurality of circuit elements TR1, TR2, TR3, 220*a* and 220*b*, the first metal layers 144, 146, 230*a* and 230*b*, and the second metal layers 240, 240*a* and 240*b*.

The cell region CELL may provide at least one memory block. The cell region CELL may include a second substrate 310 and a common source line 320. A plurality of word lines (331 to 338; collectively, 330) may be stacked on the second substrate 310 along a vertical direction Z intersecting the upper face of the second substrate 310. Insulating layers 330I may be alternatingly stacked between the word lines 330. The string selection line (e.g., UL1 and UL2 of FIG. 9) and the ground selection line (e.g., LL1 and LL2 of FIG. 9) may be placed at each of the upper part and the lower part of the word lines 330, and the plurality of word lines 330 may be placed between the string selection line and the ground selection line.

A channel structure CH may extend in the vertical direction Z and penetrate the word lines 330, the string selection lines, and the ground selection line. As shown in FIGS. 11 and 12, the channel structure CH may include a semiconductor pattern 390 and an information storage film 392.

The semiconductor pattern 390 may extend in the third direction Z. Although the semiconductor pattern 390 is shown as a cup shape, this is only an example, and the semiconductor pattern 390 may also have various shapes such as a cylindrical shape, a square barrel shape, and a solid filler shape. The semiconductor pattern 390 may include, for example, but is not limited to, semiconductor materials such as single crystal silicon, polycrystalline silicon, organic semiconductor material and carbon nanostructure.

The information storage film 392 may be interposed between the semiconductor pattern 390 and the word lines 330. For example, the information storage film 392 may extend along the side faces of the semiconductor pattern 390.

In some embodiments, the information storage film 392 may be formed of multi-films. For example, the information storage film 392 may include a tunnel insulating film 392*a*, a charge storage film 392*b* and a blocking insulating film 392*c* which are sequentially stacked on the semiconductor pattern 390. The tunnel insulating film 392*a* may include, for example, a silicon oxide or a high-k material (for example, aluminum oxide ($Al_2O_3$) and hafnium oxide ($HfO_2$)) having a higher dielectric constant than the silicon oxide. The charge storage film 392*b* may include, for example, silicon nitride. The blocking insulating film 392*c* may include, for example, a silicon oxide or a high-k material having a higher dielectric constant than the silicon oxide. In some embodiments, the information storage film 392 may further include a gate insulating film 392*d* that extends along the surface of each word line 330.

In some embodiments, the channel structure CH may further include a filling pattern 394. The filling pattern 394 may be formed to fill the inside of the cup-shaped semiconductor pattern 390. The filling pattern 394 may include, but is not limited to, insulating materials, for example, silicon oxides.

The common source line 320 may be formed to be connected to the semiconductor pattern 390 of the channel structure CH.

As shown in FIG. 11, in some embodiments, the channel structure CH may penetrate the common source line 320 and be buried in the second substrate 310. The common source line 320 may penetrate a part of the information storage film 392 and be connected to the side faces of the semiconductor pattern 390.

As shown in FIG. 12, in some embodiments, at least a part of the common source line 320 may be buried in the second substrate 310. The common source line 320 may be formed, for example, from a second substrate 310 by a selective epitaxial growth (SEG) process. The channel structure CH may penetrate a part of the information storage film 392 and be connected to the upper face of the common source line 320.

The channel structure CH may be electrically connected to the first metal layer 350*c* and the second metal layer 360*c* (FIG. 10). For example, the first metal layer 350*c* may be a bit line contact, and the second metal layer 360*c* may be a bit line (e.g., BL of FIG. 9). In some embodiments, the bit line 360*c* may extend along one direction (e.g., the second direction Y) parallel to the upper face of the second substrate 310. In some embodiments, the bit line 360*c* may be electrically connected to a fifth circuit element 220*b* that provides a page buffer (e.g., page buffer 1120 of FIG. 9) in the peripheral circuit region PERI.

The word lines 330 may extend along a direction (e.g., the first direction X) parallel to the upper face of the second substrate 310, and may be connected to the plurality of cell contact plugs 340. The word lines 330 and the cell contact plugs 340 may be connected to each other with pads provided by extension of at least some of the word lines 330 with different lengths. A first metal layer 350*b* and a second metal layer 360b may be connected sequentially to the upper part of the cell contact plugs 340 connected to the word line 330.

In some embodiments, the cell contact plugs 340 may be electrically connected to the first to third circuit elements TR1, TR2 and TR3 that provide a decoder circuit (e.g., decoder circuit 1110 of FIG. 9) in the peripheral circuit region PERI. As an example, the first metal layer 350b connected to the cell contact plug 340 may be connected to the first metal layer 350d by the second metal layer 360b. The first metal layer 350d may be connected to the second metal layer 240 through a connection contact plug 345. As a result, the first to third circuit elements TR1, TR2 and TR3 may be electrically connected to the word lines 330. For example, the first circuit element TR1 may be electrically connected to a part of the word lines 330, the second circuit element TR2 may be electrically connected to another part/one of the word lines 330, and the third circuit element TR3 may be electrically connected to still another part/one of the word lines 330.

In some embodiments, the operating voltages of the first to third circuit elements TR1, TR2 and TR3 may differ from the operating voltage of a fifth circuit element 220b that provides the page buffer (e.g., page buffer 1120 of FIG. 9). As an example, the operating voltage of the fifth circuit element 220b may be greater than the operating voltage of the first to third circuit elements TR1, TR2 and TR3.

The common source line contact plug 380 may be electrically connected to the common source line 320. The common source line contact plug 380 is formed of a conductive material such as metal, metal compound or polysilicon, and a first metal layer 350a may be formed on the common source line contact plug 380.

In some embodiments, a lower insulating film 201 that covers the lower face of the first substrate 100 may be formed below the first substrate 100, and a first I/O pad 205 may be formed on the lower insulating film 201. The first I/O pad 205 is connected to at least one of a plurality of circuit elements TR1, TR2, TR3, 220a and 220b placed in the peripheral circuit region PERI through the first I/O contact plug 203, and may be separated from the first substrate 100 by the lower insulating film 201. Further, a side insulating film is placed between the first I/O contact plug 203 and the first substrate 100, and may electrically separate the first I/O contact plug 203 and the first substrate 100.

In some embodiments, an upper insulating film 301 that covers the upper face of the second substrate 310 may be formed over the second substrate 310, and a second I/O pad 305 may be placed on the upper insulating film 301. The second I/O pad 305 may be connected to at least one of a plurality of circuit elements TR1, TR2, TR3, 220a and 220b placed in the peripheral circuit region PERI through the second I/O contact plug 303.

In some embodiments, the second substrate 310, the common source line 320 and the like may not be placed in the region in which the second I/O contact plug 303 is placed. Also, the second I/O pad 305 may not overlap the word lines 330 in the vertical direction Z. The second I/O contact plug 303 is separated from the second substrate 310 in a direction (e.g., the first direction X) parallel to the upper face of the second substrate 310, penetrates the interlayer insulating film 315 of the cell region CELL, and may be connected to the second I/O pad 305.

In some embodiments, the first I/O pad 205 and the second I/O pad 305 may be selectively formed. As an example, the nonvolatile memory device according to some embodiments includes only the first I/O pad 205 placed on the first substrate 100 or may include only the second I/O pad 305 placed on the second substrate 310. Or, the nonvolatile memory device according to some embodiments may include both the first I/O pad 205 and the second I/O pad 305.

In some embodiments, the isolation contact 146 may be electrically connected to the first I/O pad 205 or the second I/O pad 305 through the first I/O contact plug 203 or the second I/O contact plug 303. As a result, a voltage may be applied to the isolation contact 146.

Figure 13:
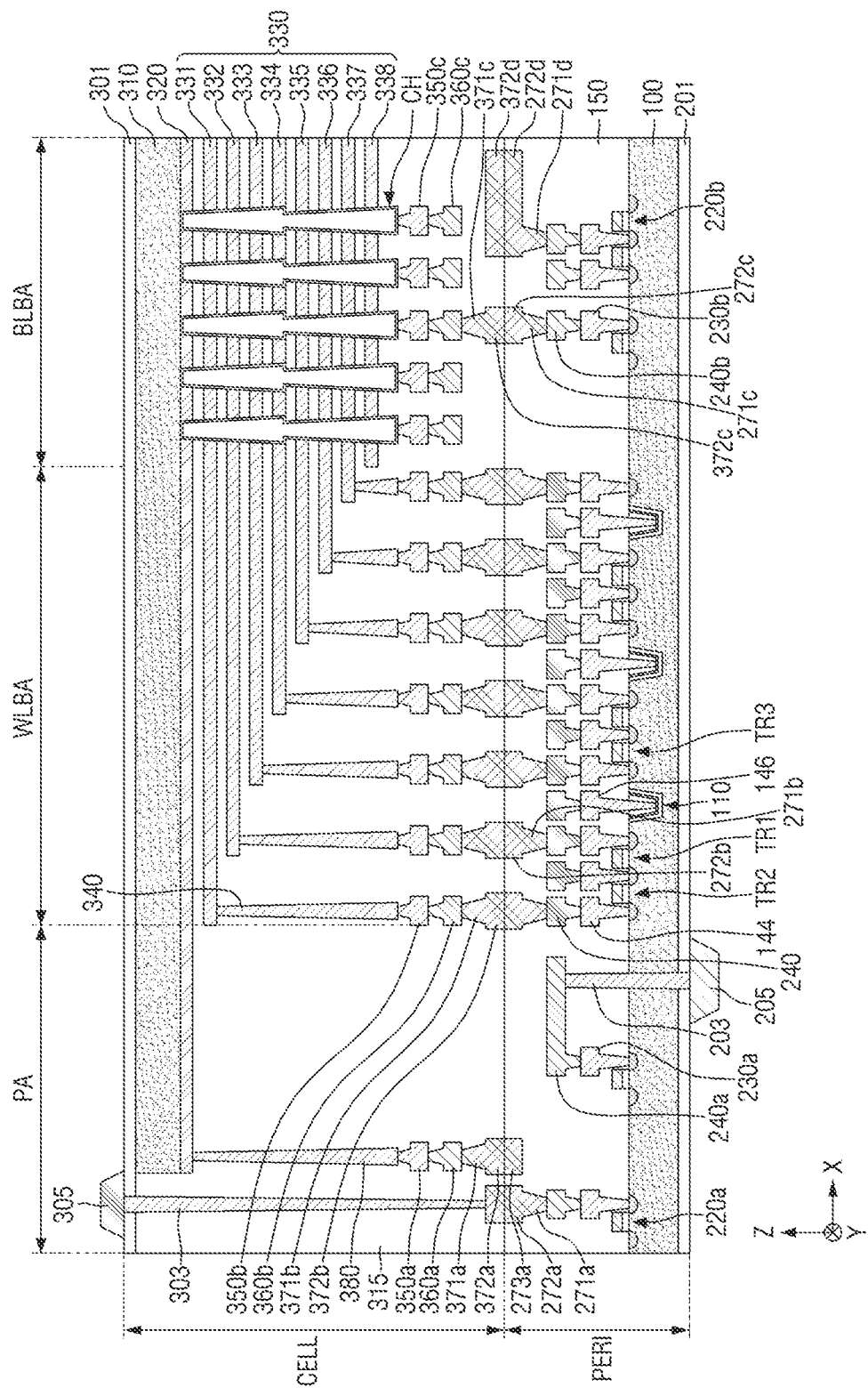
FIG. 13 is a schematic cross-sectional view for explaining the nonvolatile memory device according to some embodiments.

FIG. 13 is a schematic cross-sectional view for explaining the nonvolatile memory device according to some embodiments. For convenience of explanation, repeated parts of contents explained above using FIGS. 1 to 12 will be briefly explained or omitted.

Referring to FIG. 13, the nonvolatile memory device according to some embodiments may have a C2C (chip to chip) structure.

The C2C structure may mean a structure in which an upper chip including the cell region CELL is manufactured on the first wafer, a lower chip including the peripheral circuit region PERI is manufactured on the second wafer different from the first wafer, and then, the upper chip and the lower chip are connected to each other by a bonding way. As an example, the bonding way may mean a way of electrically connecting a bonding metal formed on the uppermost metal layer of the upper chip and a bonding metal formed on the uppermost metal layer of the lower chip to each other. For example, when the bonding metal is formed of copper (Cu), the bonding way may be a Cu—Cu bonding way, and the bonding metal may also be formed of aluminum or tungsten.

In some embodiments, the peripheral circuit region PERI and the cell region CELL may each include an external pad bonding region PA, a word line bonding region WLBA, and a bit line bonding region BLBA.

The word line bonding region WLBA may be defined as a region in which a plurality of cell contact plugs 340 and the like is placed. The lower bonding metals 271b and 272b may be formed on the second metal layer 240 of the word line bonding region WLBA. In the word line bonding region WLBA, the lower bonding metals 271b and 272b of the peripheral circuit region PERI may be electrically connected to the upper bonding metals 371b and 372b of the cell region CELL by the bonding way. The lower bonding metals 271b and 272b and the upper bonding metals 371b and 372b may be formed of aluminum, copper, tungsten, or the like. The cell contact plugs 340 may be connected to the peripheral circuit region PERI through the upper bonding metals 371b and 372b of the cell region CELL and the lower bonding metals 271b and 272b of the peripheral circuit region PERI in the word line bonding region WLBA.

The bit line bonding region BLBA may be defined as a region in which the channel structure CH, the bit line 360c and the like are placed. The bit line 360c may be electrically connected to the fifth circuit element 220b in the bit line bonding region BLBA. As an example, the bit line 360c is connected to the upper bonding metals 371c and 372c in the cell region CELL, and the upper bonding metals 371c and 372c may be connected to the lower bonding metals 271c and 272c connected to the fifth circuit element 220b.

A common source line contact plug 380 may be placed in the external pad bonding region PA. The common source line contact plug 380 is formed of a conductive material such as metal, metal compound or polysilicon, and may be electrically connected to the common source line 320. A first metal layer 350a and a second metal layer 360a may be sequentially stacked over the common source line contact plug 380. As an example, the region in which the common source line contact plug 380, the first metal layer 350a, and the second metal layer 360a are placed may be defined as the external pad bonding region PA. Also, I/O pads 205 and 305 may be placed in the external pad bonding region PA.

A metal pattern of the uppermost metal layer exists as a dummy pattern in each of the external pad bonding region PA and the bit line bonding region BLBA included in the cell region CELL and the peripheral circuit region PERI, or the uppermost metal layer may be empty.

The nonvolatile memory device according to some embodiments may form a lower metal pattern 273a having the same shape as the upper metal pattern 372a of the cell region CELL on the uppermost metal layer of the peripheral circuit region PERI to correspond to the upper metal pattern 372a formed on the uppermost metal layer of the cell region CELL, in the external pad bonding region PA. The lower metal pattern 273a formed on the uppermost metal layer of the peripheral circuit region PERI may not be connected to another contact in the peripheral circuit region PERI. Similarly, an upper metal pattern having the same shape as the lower metal pattern 272d of the peripheral circuit region PERI may be formed on the upper metal layer of the cell region CELL to correspond to the lower metal pattern formed on the uppermost metal layer of the peripheral circuit region PERI in the external pad bonding region PA.

Also, in the bit line bonding region BLBA, an upper metal pattern 372d having the same shape as the lower metal pattern 272d of the peripheral circuit region PERI may be formed on the uppermost metal layer of the cell region CELL to correspond to the lower metal pattern 272d formed on the uppermost metal layer of the peripheral circuit region PERI. The contact may not be formed on the upper metal pattern 372d formed on the uppermost metal layer of the cell region CELL.

Hereinafter, a method for fabricating a semiconductor device according to some embodiments will be explained referring to FIGS. 1 to 24.

FIGS. 14 to 20 are intermediate step diagrams for explaining the method for fabricating the semiconductor device according to some embodiments. For convenience of explanation, repeated parts of contents explained above using FIGS. 1 to 13 will be briefly described or omitted.

Figure 14:
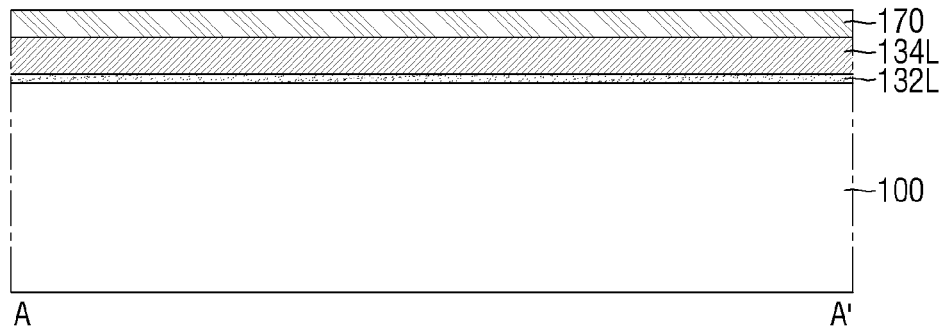
FIGS. 14 to 20 are intermediate step diagrams for explaining the method for fabricating the semiconductor device according to some embodiments.

Referring to FIG. 14, a preliminary gate dielectric film 132L, a gate electrode film 134L and a sacrificial film 170 are sequentially formed on the first substrate 100.

The preliminary gate dielectric film 132L may include, for example, silicon oxide, silicon oxynitride, silicon nitride, and high-k materials having a higher dielectric constant than silicon oxide.

The gate electrode film 134L may include, for example but is not limited to, at least one of polycrystalline silicon (poly Si), amorphous silicon (a-Si), titanium (Ti), titanium nitride (TiN), tungsten nitride (WN), titanium aluminum (TiAl), titanium aluminum nitride (TiAlN), tantalum nitride (TaN), titanium carbide (TiC), tantalum carbide (TaC), tantalum carbonitride (TaCN), tantalum silicon nitride (TaSiN), tantalum (Ta), cobalt (Co), ruthenium (Ru), aluminum (Al), tungsten (W) and combinations thereof.

The sacrificial film 170 may include, for example, but is not limited to, silicon oxides. As an example, the sacrificial film 170 may include PEOX (Plasma Enhance Oxide).

Figure 15:
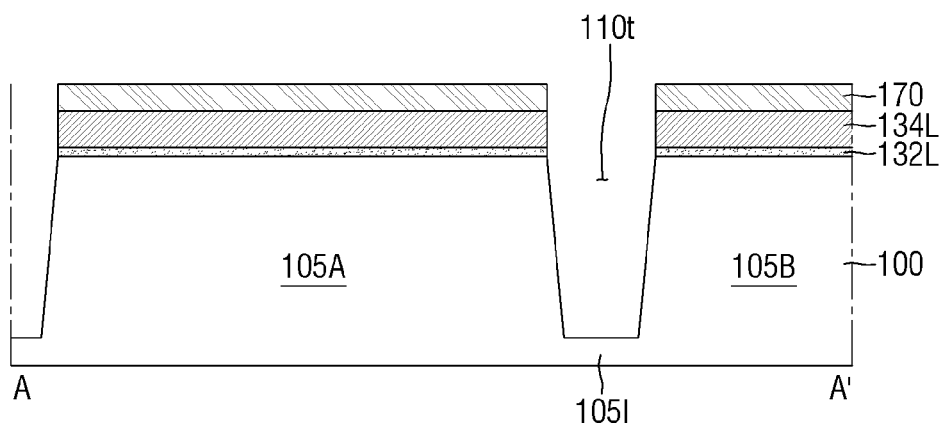

Referring to FIG. 15, an element isolation trench 110t is formed in the first substrate 100.

The element isolation trench 110t may define a plurality of active regions 105A, 105B, 105C and 105D in the first substrate 100. Further, the element isolation trench 110t may define the isolation region 105I in the first substrate 100 on the lower face of the element isolation trench 110t.

Figure 16:
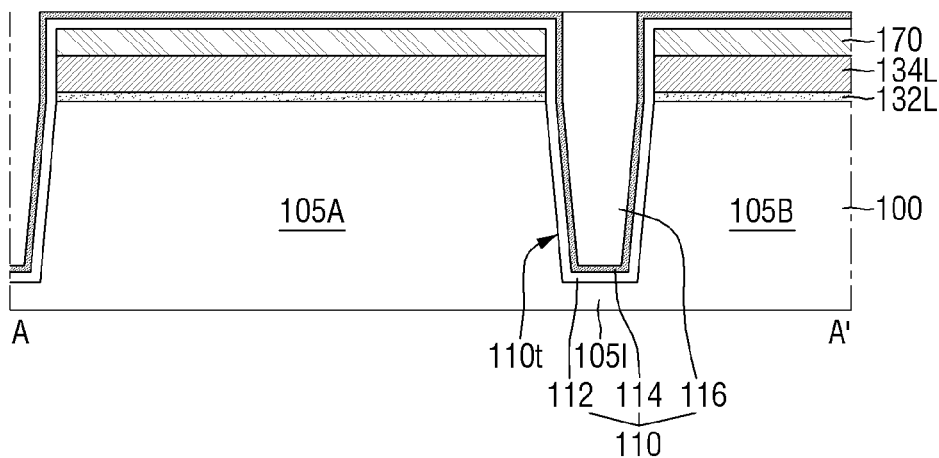

Referring to FIG. 16, an insulating liner 112, an etching blocking liner 114 and a gap fill insulating film 116 are sequentially formed in the element isolation trench 110t.

The insulating liner 112 may extend along the profiles of the side face of the lower face of the element isolation trench 110t in a conformal manner. The etching blocking liner 114 may extend along the profile of the insulating liner 112 in a conformal manner. The gap fill insulating film 116 may fill the region of the element isolation trench 110t that remains after the insulating liner 112 and the etching blocking liner 114 are formed.

In some embodiments, the etching blocking liner 114 may include a material having an etching selectivity with respect to the insulating liner 112 and the gap fill insulating film 116. As an example, the insulating liner 112 and the gap fill insulating film 116 may include silicon oxide, and the etching blocking liner 114 may include silicon nitride.

Figure 17:
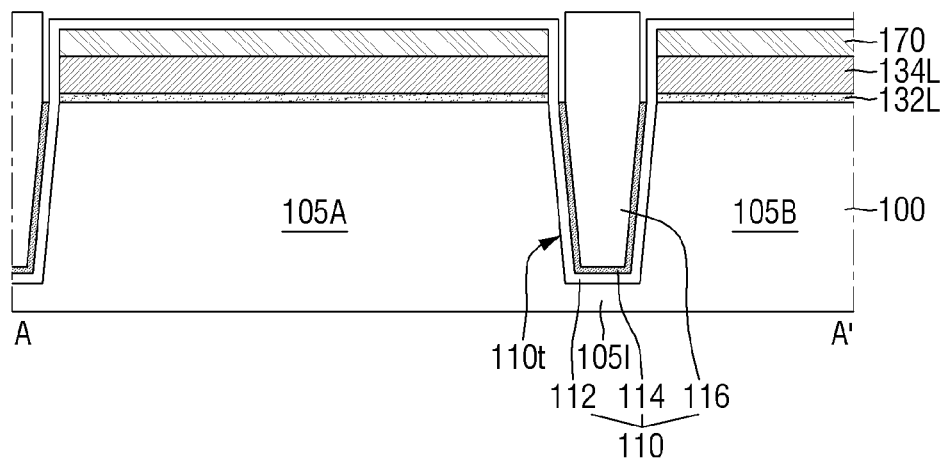

Referring to FIG. 17, a part of the etching blocking liner 114 is removed.

For example, the recess process of the etching blocking liner 114 may be performed. In some embodiments, since the insulating liner 112 and the gap fill insulating film 116 may include a material having an etching selectivity with respect to the etching blocking liner 114, the etching blocking liner 114 may be selectively removed.

Figure 18:
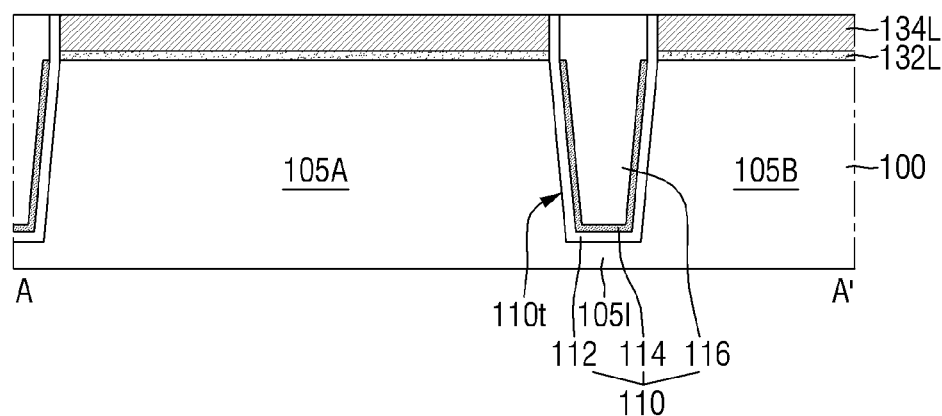

Referring to FIG. 18, a flattening process is performed.

For example, an insulating film that fills the region from which the etching blocking liner 114 is removed may be formed. Subsequently, the flattening process may be performed. The flattening process may include, but is not limited to, for example, a chemical mechanical polishing (CMP) process. As a result, the element isolation film 110 that fills the element isolation trench 110t may be formed.

In some embodiments, the sacrificial film 170 may be removed by the flattening process. As a result, the upper face of the gate electrode film 134L, the upper face of the insulating liner 112 and the upper face of the gap fill insulating film 116 may be exposed.

Figure 19:
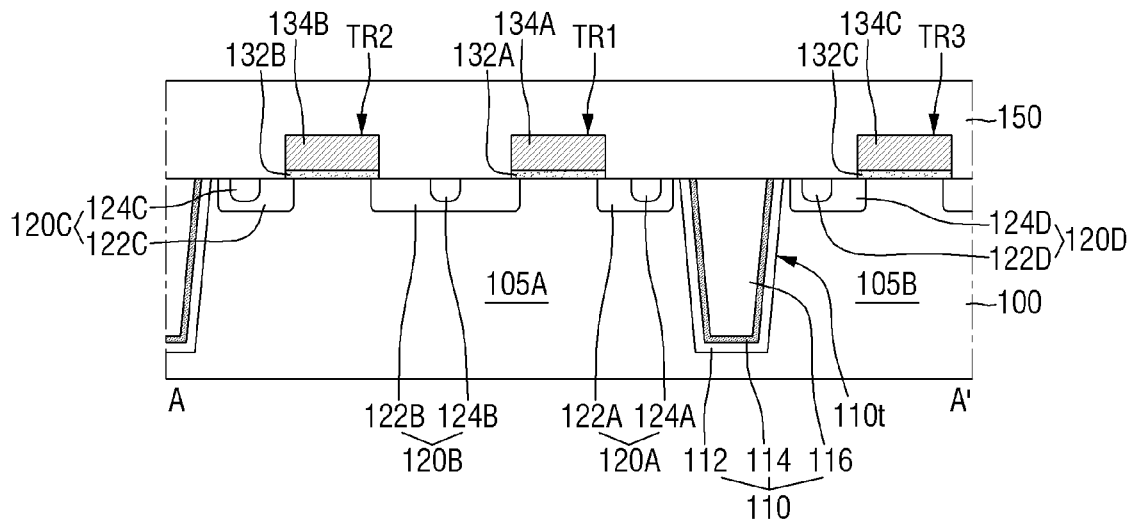

Referring to FIG. 19, the first to third circuit elements TR1, TR2 and TR3 and the interlayer insulating film 150 are formed on the first substrate 100.

The first to third circuit elements TR1, TR2 and TR3 may be formed on the active regions 105A, 105B, 105C and 105D. For example, the first circuit element TR1 and the second circuit element TR2 may be placed on the first active region 105A, and the third circuit element TR3 may be placed on the second active region 105B.

Subsequently, an interlayer insulating film 150 that covers the first to third circuit elements TR1, TR2 and TR3 may be formed on the first substrate 100.

Figure 20:
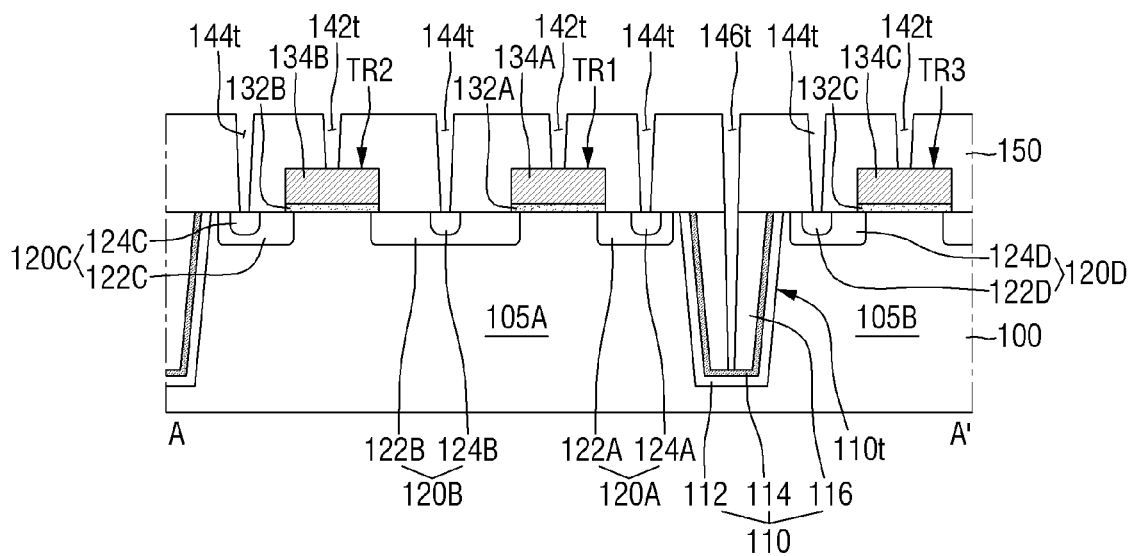

Referring to FIG. 20, a first contact hole 142t, a second contact hole 144t and a third contact hole 146t are formed in the interlayer insulating film 150.

The first contact hole 142t may penetrate the interlayer insulating film 150 to expose the first to third gate electrodes 134A, 134B and 134C. The second contact hole 144t may penetrate the interlayer insulating film 150 to expose the first to fourth source/drain regions 120A, 120B, 120C and 120D of the first to fourth source/drain regions. The third contact hole 146t may penetrate the interlayer insulating film 150 to expose the element isolation film 110.

In some embodiments, the third contact hole 146t may penetrate the interlayer insulating film 150 and the gap fill insulating film 116 to expose the etching blocking liner 114.

Since the etching blocking liner 114 may include a material having an etching selectivity with respect to the gap fill insulating film 116, the etching blocking liner 114 may be used as an etching blocking film in the process of forming the third contact hole 146t.

The third contact hole 146t may be formed at the same time as the first contact hole 142t and/or the second contact hole 144t, and may alternatively be formed before the first contact hole 142t and/or the second contact hole 144t are formed or after the first contact hole 142t and/or the second contact hole 144t are formed.

Subsequently, referring to FIG. 2, the gate contact 142, the source/drain contact 144 and the isolation contact 146 are formed.

The gate contact 142 may fill the first contact hole 142t. Therefore, the gate contact 142 may be connected to each of the first to third gate electrodes 134A, 134B and 134C. The source/drain contact 144 may fill the second contact hole 144t. Thus, the source/drain contact 144 may be connected to the respective first to fourth source/drain regions 120A, 120B, 120C and 120D. The isolation contact 146 may fill the third contact hole 146t. Therefore, at least a part of the isolation contact 146 may be placed in the element isolation film 110.

Figure 21:
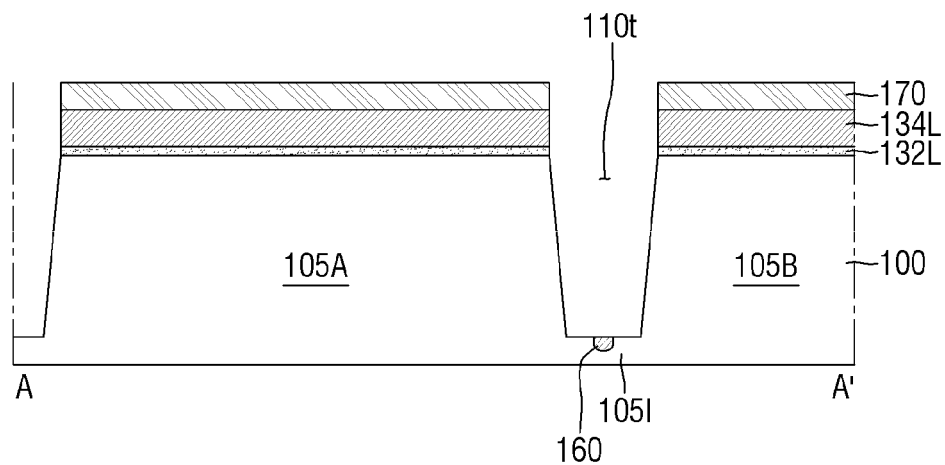
FIGS. 21 to 24 are intermediate step diagrams for explaining the method for fabricating the semiconductor device according to some embodiments.

FIGS. 21 to 24 are intermediate step diagrams for explaining the method for fabricating the semiconductor device according to some embodiments. For convenience of explanation, repeated parts of contents explained above using FIGS. 1 to 20 will be briefly described or omitted. For reference, FIG. 21 is a diagram for explaining the step after FIG. 15.

Referring to FIG. 21, a contact impurity region 160 is formed in the isolation region 105I.

For example, a contact impurity region 160 may be formed in a portion of the isolation region 105I exposed by the element isolation trench 110t. Formation of the contact impurity region 160 may include, but is not limited to, for example, an ion implantation process.

Figure 22:
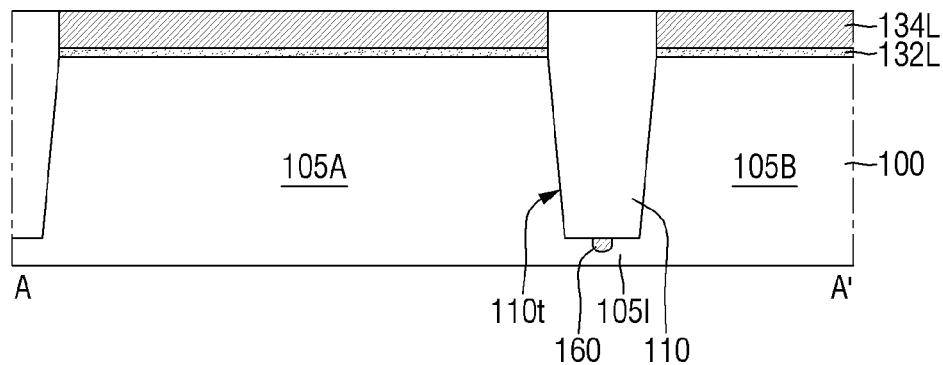

Referring to FIG. 22, the element isolation film 110 is formed in the element isolation trench 110t.

Although the element isolation film 110 is shown as only being formed of a single film in FIG. 22, this is merely an example. For example, the element isolation film 110 may, of course, be formed of multi-films.

Figure 23:
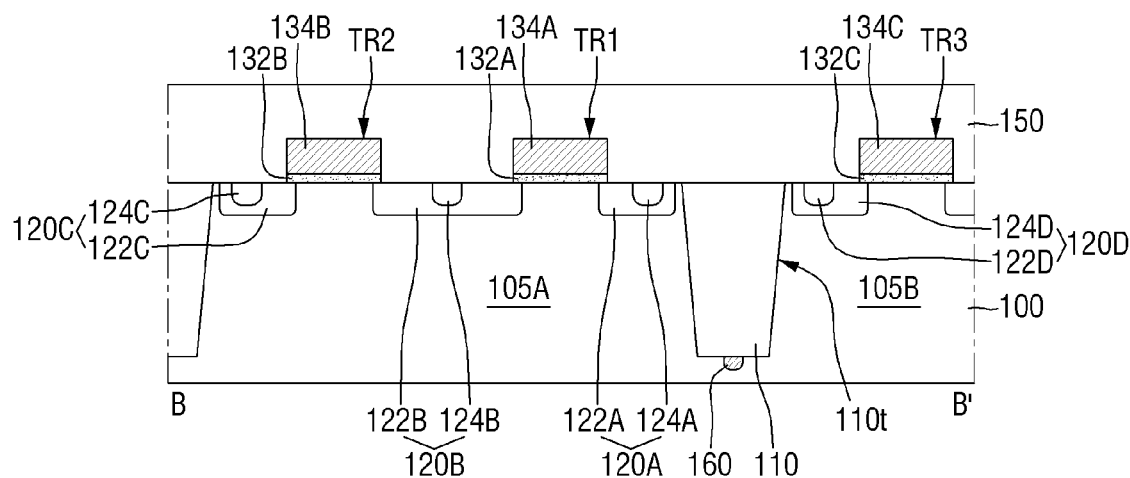

Referring to FIG. 23, the first to third circuit elements TR1, TR2 and TR3 and the interlayer insulating film 150 are formed on the first substrate 100. Since formation of the first to third circuit elements TR1, TR2 and TR3 and the interlayer insulating film 150 is similar to that explained above referring to FIG. 19, detailed explanation thereof will not be provided below.

Figure 24:
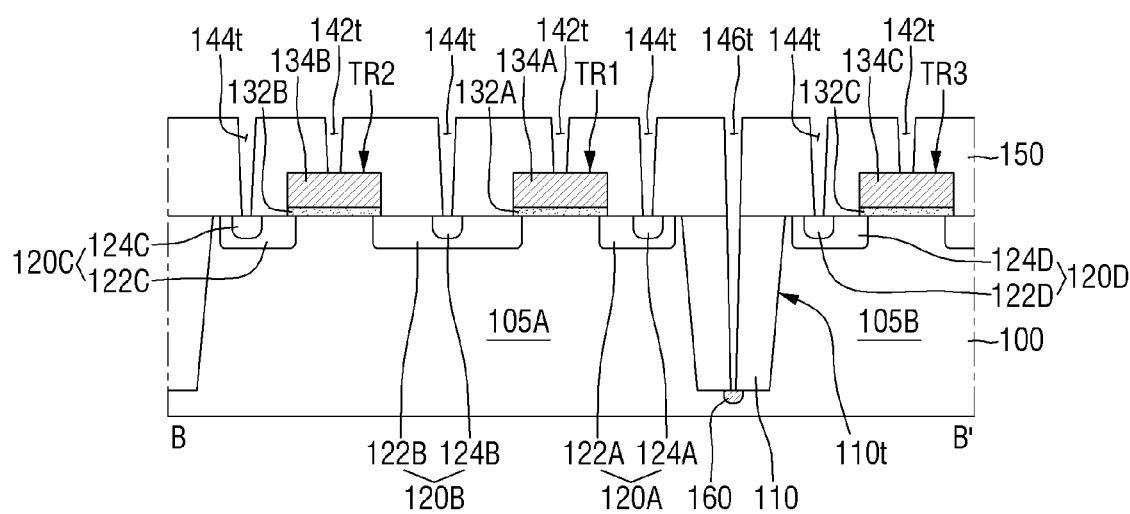

Referring to FIG. 24, a first contact hole 142t, a second contact hole 144t and a third contact hole 146t are formed in the interlayer insulating film 150. Since the formation of the first contact hole 142t and the second contact hole 144t is similar to that explained above referring to FIG. 20, detailed explanation thereof will not be provided below.

In some embodiments, the third contact hole 146t may penetrate the element isolation film 110 to expose the contact impurity region 160. The third contact hole 146t may be formed at the same time as the first contact hole 142t and/or the second contact hole 144t, and may alternatively be formed before the first contact hole 142t and/or the second contact hole 144t are formed or after the first contact hole 142t and/or the second contact hole 144t are formed.

Subsequently, referring to FIG. 6, the gate contact 142, the source/drain contact 144a and the isolation contact 146 are formed. Since formation of the gate contact 142, the source/drain contact 144 and the isolation contact 146 is similar to that explained above using FIG. 2, detailed explanation thereof will not be provided below.

Hereinafter, the nonvolatile memory devices according to some embodiments will be explained referring to FIGS. 1 to 28.

Figure 25:
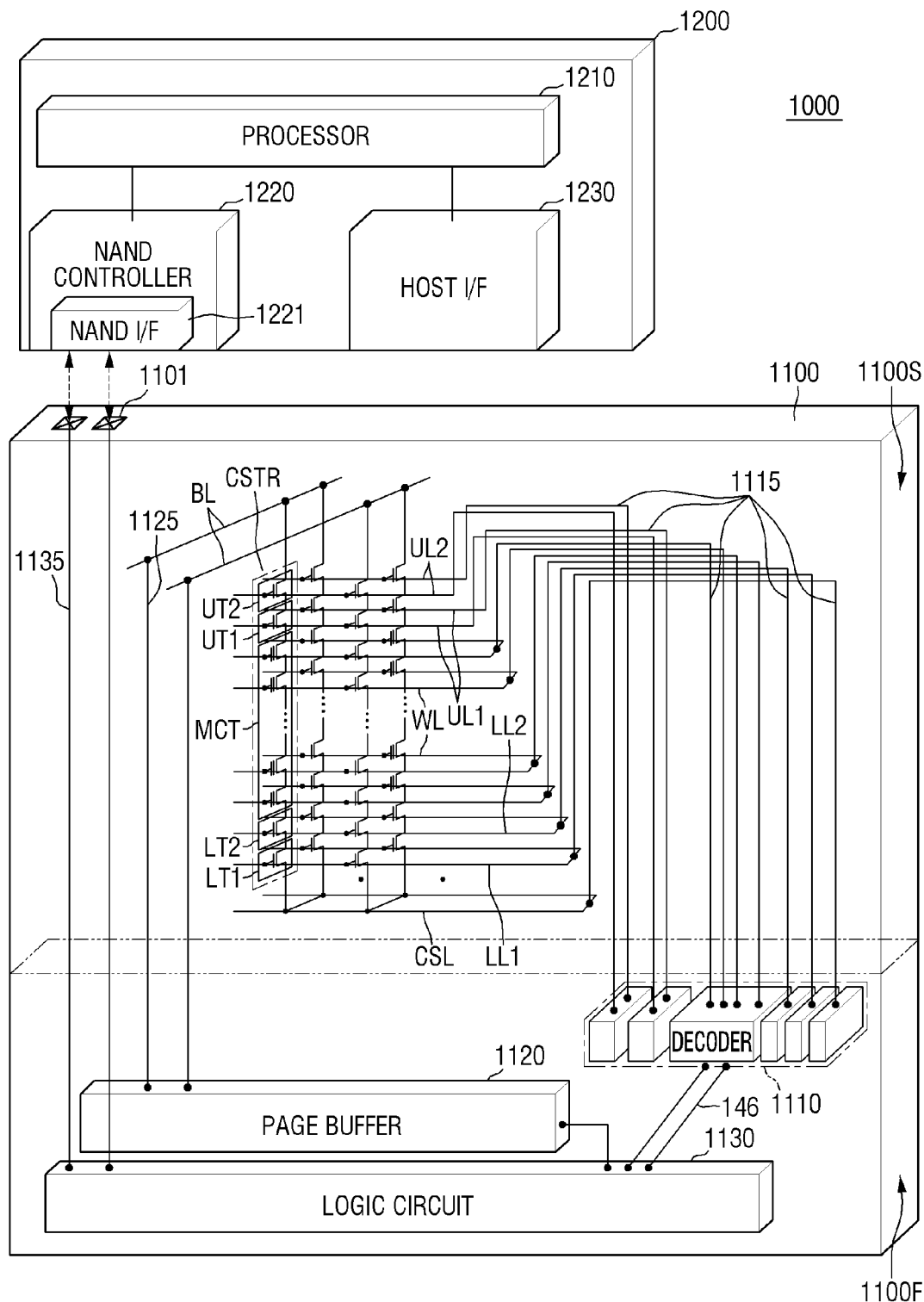
FIG. 25 is a schematic block diagram for explaining an electronic system according to some embodiments.
Figure 26:
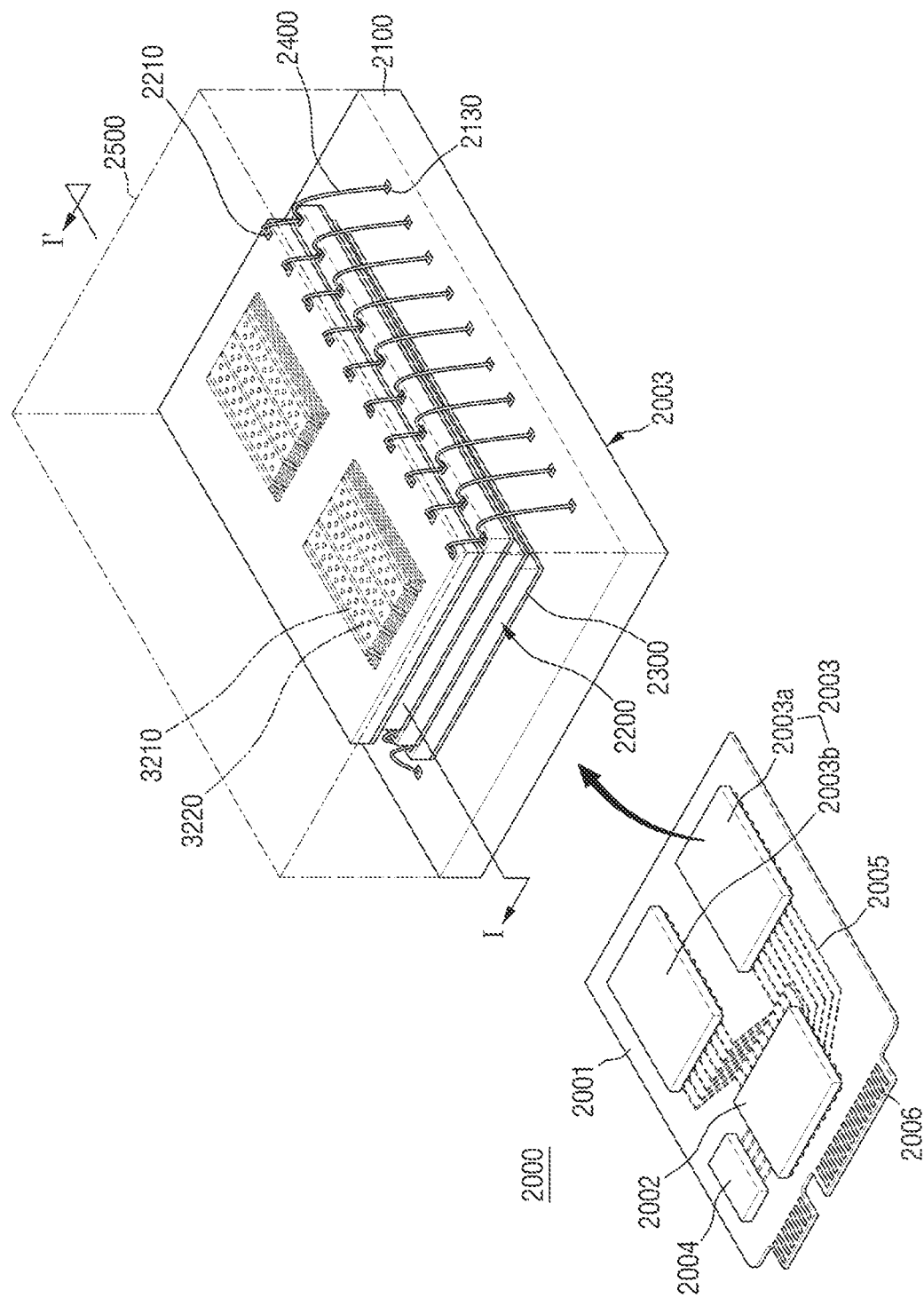
FIG. 26 is a schematic perspective view for explaining the electronic system according to some embodiments.
Figure 27:
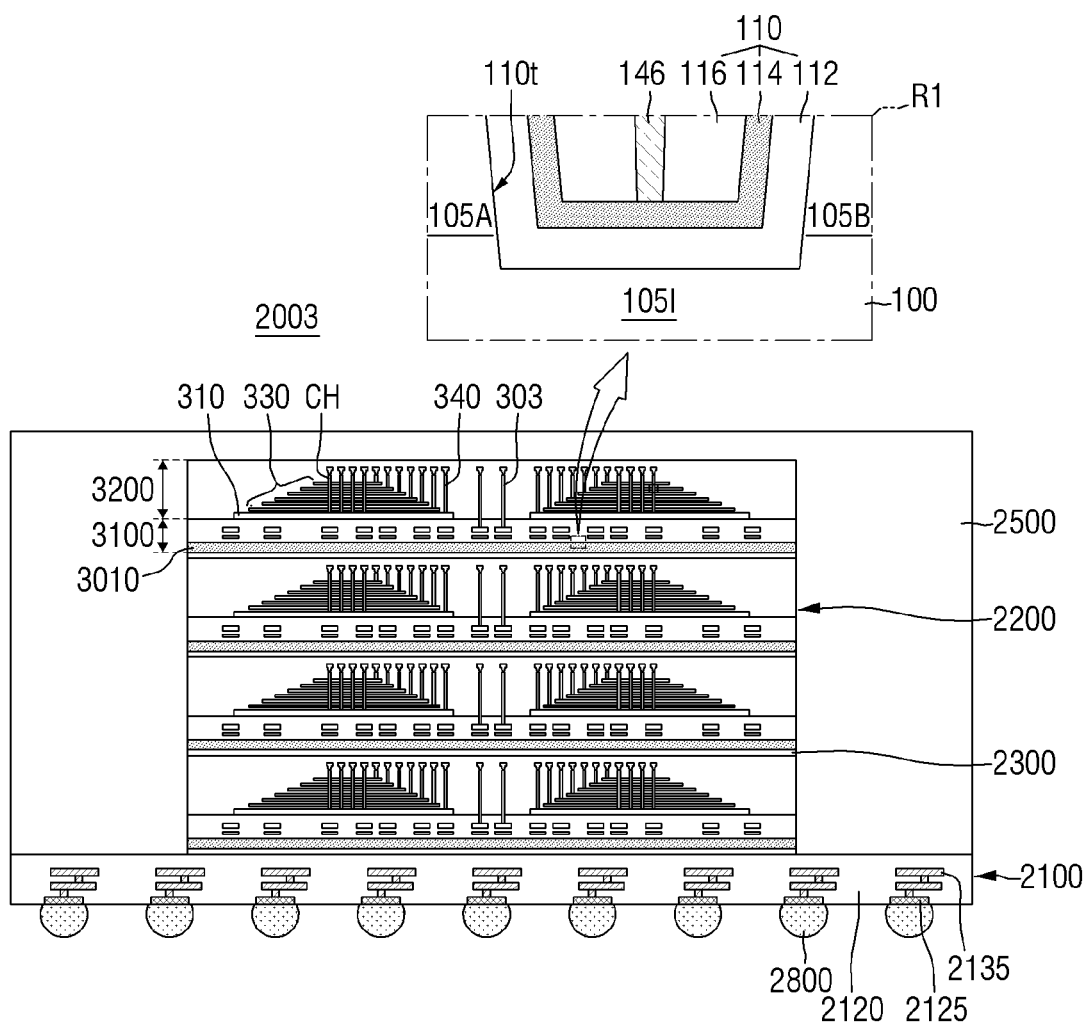
FIGS. 27 and 28 are various schematic cross-sectional views taken along a line "I-I" of FIG. 26.
Figure 28:
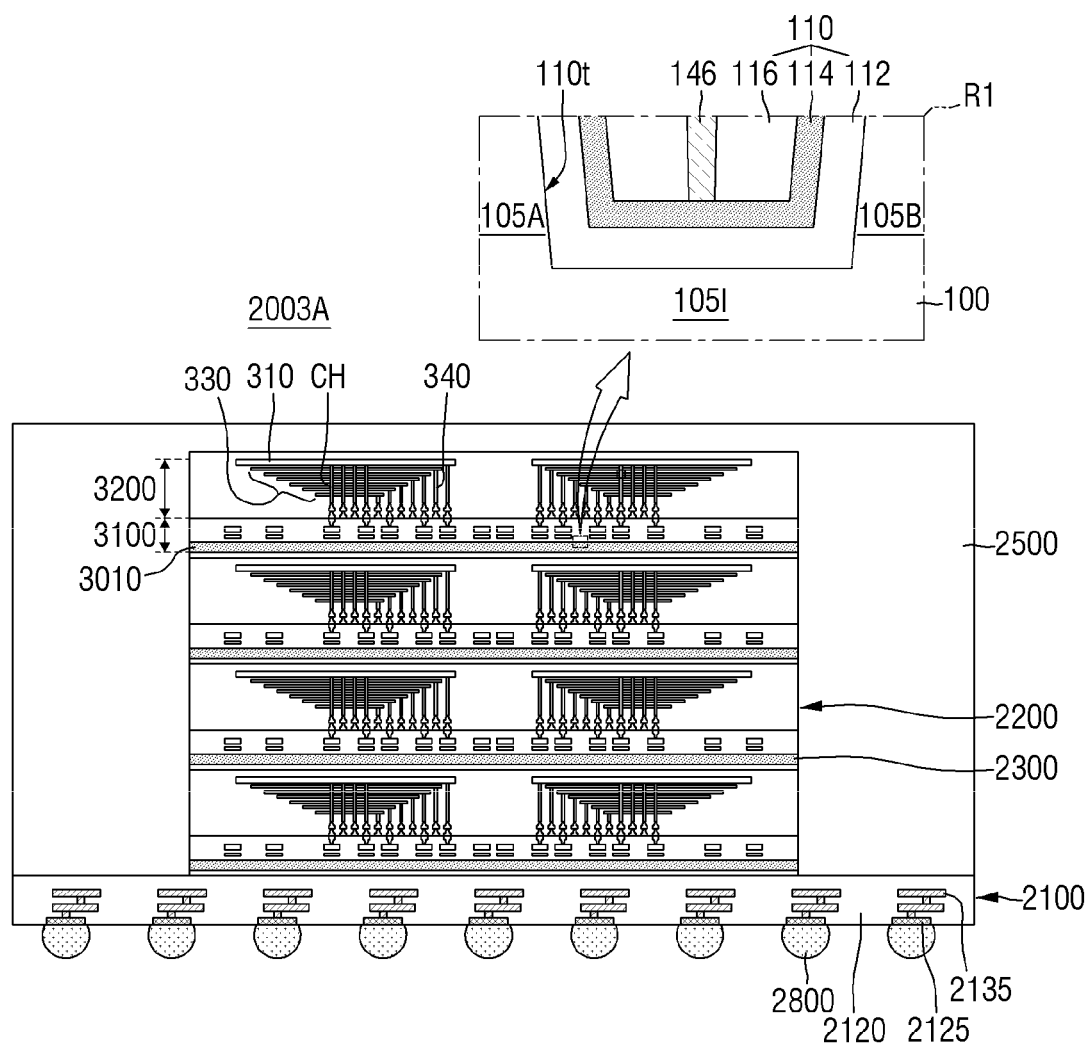

FIG. 25 is a schematic block diagram for explaining an electronic system according to some embodiments. FIG. 26 is a schematic perspective view for explaining the electronic system according to some embodiments. FIGS. 27 and 28 are various schematic cross-sectional views taken along a line "I-I" of FIG. 26. For convenience of explanation, repeated parts of contents explained above using FIGS. 1 to 24 will be briefly explained or omitted.

Referring to FIG. 25, an electronic system 1000 according to some embodiments may include a semiconductor (e.g., nonvolatile memory) device 1100, and a controller 1200 that is electrically connected to the semiconductor device 1100. The electronic system 1000 may be a storage device that includes a single or multiple semiconductor devices 1100, or an electronic device that includes the storage device. For example, the electronic system 1000 may be an SSD device (solid state drive device) including a single or multiple semiconductor devices 1100, a USB (Universal Serial Bus), a computing system, a medical device or a communication device.

The semiconductor device 1100 may be a nonvolatile memory device (e.g., a NAND flash memory device), and may be, for example, the nonvolatile memory device described above referring to FIGS. 9 to 13. The semiconductor device 1100 may communicate with the controller 1200 through an I/O pad 1101 that is electrically connected to the logic circuit 1130. The I/O pad 1101 may be electrically connected to the logic circuit 1130 through the I/O connection wiring 1135 extending from the inside of the first structure 1100F to the second structure 1100S. The I/O connection wiring 1135, for example, may be the first I/O contact plug 203 or the second I/O contact plug 303 which is described above with reference to FIGS. 9 to 13. In some embodiments, the isolation contact 146 may be connected to the I/O pad 1101 through the I/O connection wiring 1135. For example, as described above, the isolation contact 146 may be connected to the logic circuit 1130. Accordingly, the isolation contact 146 may be controlled by the controller 1200 and a voltage may be applied to the isolation contact 146.

The controller 1200 may include a processor 1210, a NAND controller 1220, and a host interface (I/F) 1230. In some embodiments, the electronic system 1000 may include a plurality of semiconductor devices 1100, and in this case, the controller 1200 may control the plurality of semiconductor devices 1100.

The processor 1210 may control the operation of the overall electronic system 1000 including the controller 1200. The processor 1210 may operate in accordance with a predetermined firmware, and may control the NAND controller 1220 to access the semiconductor device 1100. The NAND controller 1220 may include a NAND interface 1221 that processes communication with the semiconductor device 1100. Control commands for controlling the semiconductor device 1100, data to be recorded in the memory cell transistor MCT of the semiconductor device 1100, data to be read from the memory cell transistors MCT of the semiconductor device 1100, and the like may be sent through the NAND interface 1221. The host interface 1230 may provide a communication function between the electronic system 1000 and an external host. When receiving the control commands from an external host through the host interface 1230, the processor 1210 may control the semiconductor device 1100 in response to the control command.

Referring to FIG. 26, the electronic system 2000 according to some embodiments may include a main substrate 2001, a main controller 2002 mounted on the main substrate 2001, one or more semiconductor packages 2003, and a DRAM 2004. The semiconductor package 2003 and the DRAM 2004 may be connected to the main controller 2002 by wiring patterns 2005 formed on the main substrate 2001.

The main substrate 2001 may include a connector 2006 including the plurality of fins coupled to an external host. In the connector 2006, the number and arrangement of the plurality of fins may vary depending on the communication interface between the electronic system 2000 and the external host. In some embodiments, the electronic system 2000 may communicate with an external host in accordance with any one of interfaces such as M-Phy for a USB (Universal Serial Bus), a PCI-Express (Peripheral Component Interconnect Express), a SATA, (Serial Advanced Technology Attachment), and an UFS (Universal Flash Storage). In some embodiments, the electronic system 2000 may operate by a power supplied from an external host through the connector 2006. The electronic system 2000 may further include a PMIC (Power Management Integrated Circuit) that distributes the power supplied from the external host to the main controller 2002 and the semiconductor package 2003.

The main controller 2002 may record data in the semiconductor package 2003 or read data from the semiconductor package 2003, and may improve the operating speed of the electronic system 2000.

The DRAM 2004 may be a buffer memory for reducing a speed difference between the semiconductor package 2003, which is a data storage space, and the external host. The DRAM 2004 included in the electronic system 2000 may also operate as a kind of cache memory, and may also provide a space for temporarily storing data in the control operation of the semiconductor package 2003. When the DRAM 2004 is included in the electronic system 2000, the main controller 2002 may further include a DRAM controller for controlling the DRAM 2004 in addition to the NAND controller for controlling the semiconductor package 2003.

The semiconductor package 2003 may include first and second semiconductor packages 2003a and 2003b that are spaced apart from each other. The first and second semiconductor packages 2003a and 2003b may be semiconductor packages including a plurality of semiconductor chips 2200, respectively. Each of the first and second semiconductor packages 2003a and 2003b may include a package substrate 2100, semiconductor chips 2200 on the package substrate 2100, adhesive layers 2300 placed on each lower face of the semiconductor chips 2200, a connection structure 2400 that electrically connects the semiconductor chips 2200 and the package substrate 2100, and a molding layer 2500 that covers the semiconductor chips 2200 and the connection structure 2400 on the package substrate 2100.

The package substrate 2100 may be a printed circuit board that includes package upper pads 2130. Each semiconductor chip 2200 may include an I/O pad 2210. The I/O pad 2210 may correspond to the I/O pad 1101 of FIG. 25. Each of the semiconductor chips 2200 may include memory blocks 3210 and channel structures 3220. The memory blocks 3210 may correspond to the memory block of FIG. 10, and the channel structures 3220 may correspond to the channel structure CH of FIG. 10. Each of the semiconductor chips 2200 may include the nonvolatile memory device explained above using FIGS. 9 to 13.

In some embodiments, the connection structure 2400 may be a bonding wire that electrically connects the I/O pad 2210 and the package upper pads 2130. Therefore, in each of the first and second semiconductor packages 2003a and 2003b, the semiconductor chips 2200 may be electrically connected to each other by the bonding wire way, and may be electrically connected to the package upper pads 2130 of the package substrate 2100. In some embodiments, in the first and second semiconductor packages 2003a and 2003b, the semiconductor chips 2200 may also be electrically connected to each other by a connection structure including a through silicon via (TSV), in place of the bonding wire type of connection structure 2400.

In some embodiments, the main controller 2002 and the semiconductor chips 2200 may also be included in a single package. In some embodiments, the main controller 2002 and the semiconductor chips 2200 are mounted on another interposer substrate different from the main substrate 2001, and the main controller 2002 and the semiconductor chips 2200 may also be connected to each other by the wirings formed on the interposer substrate.

Referring to FIG. 27, in the semiconductor package 2003, the package substrate 2100 may be a printed circuit board. The package substrate 2100 may include a package substrate body portion 2120, package upper pads (2130 of FIG. 26) placed on the upper face of the package substrate body portion 2120, lower pads 2125 placed on the lower face of the package substrate body portion 2120 or exposed through the lower face, and internal wirings 2135 that electrically connect the upper pads 2130 and the lower pads 2125 inside the package substrate body portion 2120. The upper pads 2130 may be electrically connected to the connecting structures 2400. The lower pads 2125 may also be connected to the wiring patterns 2005 of the main substrate 2100 of the electronic system 2000 through the conductive connections 2800, as in FIG. 26.

Each of the semiconductor chips 2200 may include a semiconductor substrate 3010, and a first structure 3100 and a second structure 3200 sequentially stacked on the semiconductor substrate 3010. The semiconductor substrate 3010 may correspond to the first substrate 100 of FIG. 10. The first structure 3100 may correspond to the peripheral circuit region PERI of FIG. 10, and the second structure 3200 may correspond to the cell region CELL of FIG. 10.

For example, the second structure 3200 may include a second substrate 310, a plurality of word lines 330, a channel structure CH, and a plurality of cell contact plugs 340. In some embodiments, as shown, the first structure 3100 may include an element isolation film 110 and an isolation contact 146. Each of the semiconductor chips 2200 may further include an I/O pad (pad 2210 of FIG. 26) that is electrically connected to the first structure 3100.

Referring to FIG. 28, in the semiconductor package 2003A, each of the semiconductor chips 2200 may include a first structure 3100 and a second structure 3200 bonded by a wafer bonding way. For example, the first structure 3100 may correspond to the peripheral circuit region PERI of FIG. 13, and the second structure 3200 may correspond to the cell region CELL of FIG. 13.

The semiconductor chips 2200 of FIGS. 27 and 28 may be electrically connected to each other by connection structures in the form of bonding wires (structures 2400 of FIG. 26). However, in some embodiments, the semiconductor chips inside the single semiconductor package, such as the semiconductor chips 2200 of FIGS. 27 and 28, may be electrically connected to each other by a connecting structure including the through silicon via (TSV).

What is claimed is:

1. A semiconductor device comprising:
a substrate;
an element isolation film that defines a first active region in the substrate, the element isolation film comprising an insulating liner, an etching blocking liner on the insulating liner, and a gap fill insulating film that is on the etching blocking liner;
a first gate electrode on the first active region;
a first source/drain region located inside the first active region between the element isolation film and the first gate electrode; and
an isolation contact that extends in a vertical direction intersecting an upper face of the substrate, in the gap fill insulating film,
wherein a lower face of the isolation contact is in contact with the etching blocking liner of the element isolation film, and
wherein the isolation contact is configured to have a voltage applied thereto.

2. The semiconductor device of claim 1,
wherein the first source/drain region includes n-type impurities, and
wherein the voltage comprises a ground voltage or a negative voltage.

3. The semiconductor device of claim 1, further comprising:
an interlayer insulating film that is on the first gate electrode, the substrate, and the element isolation film,
wherein the isolation contact extends in the vertical direction from the element isolation film into the interlayer insulating film.

4. The semiconductor device of claim 3, further comprising:
a source/drain contact that penetrates the interlayer insulating film and is electrically connected to the first source/drain region,
wherein the isolation contact and the source/drain contact include the same material.

5. The semiconductor device of claim 1,
wherein the substrate includes an element isolation trench that defines the first active region, and
wherein the insulating liner extends along a profile of the element isolation trench.

6. The semiconductor device of claim 5, wherein the isolation contact extends in the vertical direction through the gap fill insulating film and into contact with the etching blocking liner.

7. The semiconductor device of claim 1, further comprising:
a second gate electrode spaced apart from the first gate electrode and extending alongside the first gate electrode, on the first active region; and
a second source/drain region inside the first active region between the first gate electrode and the second gate electrode,
wherein the first source/drain region and the second source/drain region include impurities of the same conductive type.

8. The semiconductor device of claim 1, further comprising:
a second active region separated from the first active region by the element isolation film, in the substrate;
a second gate electrode extending alongside the first gate electrode, on the second active region; and
a second source/drain region inside the second active region between the element isolation film and the second gate electrode,
wherein the first source/drain region and the second source/drain region include impurities of the same conductivity type.

9. A semiconductor device comprising:
a substrate including an element isolation trench that defines an active region;
an element isolation film that includes an insulating liner extending along a profile of the element isolation trench, an etching blocking liner on the insulation liner, and a gap fill insulating film that is in the element isolation trench on the etching blocking liner;
a gate electrode on the active region;
a source/drain region in the active region between the element isolation film and the gate electrode; and
an isolation contact in the element isolation film, wherein the isolation contact extends in the gap fill insulating film in a vertical direction and has a lower face in contact with the etching blocking liner, the vertical direction intersecting an upper face of the substrate.

10. The semiconductor device of claim 9, wherein the etching blocking liner extends along a profile of the insulating liner.

11. The semiconductor device of claim 9,
wherein the isolation contact is configured to have a ground voltage or a negative voltage applied thereto and the source/drain region includes n-type impurities, or
wherein the isolation contact is configured to have the ground voltage or a positive voltage is applied thereto and the source/drain region includes p-type impurities.

12. The semiconductor device of claim 9, wherein the lower face of the isolation contact is spaced apart from a lower face of the element isolation film.

13. The semiconductor device of claim 12, wherein the insulating liner and the etching blocking liner are between the lower face of the element isolation film and the lower face of the isolation contact.

14. The semiconductor device of claim 12, wherein a spaced distance of the lower face of the isolation contact from the lower face of the element isolation film is 100 Angstroms (Å) to 4000 Å.

15. The semiconductor device of claim 9,
wherein the etching blocking liner includes silicon nitride, and
wherein the gap fill insulating film includes at least one of silicon oxide, silicon carbonitride, and silicon oxycarbonitride.

16. A nonvolatile memory device that includes a first substrate of a peripheral circuit region, and a second substrate of a cell region, the nonvolatile memory device comprising:
a first circuit element and a second circuit element on the first substrate;
an element isolation film that separates the first circuit element and the second circuit element in the first substrate, the element isolation film comprising an insulating liner, an etching blocking liner on the insulating liner, and a gap film insulating film on the etching blocking liner;
an isolation contact that extends in a vertical direction intersecting an upper face of the first substrate in the gap fill insulating film and having a lower face in contact with the etching blocking liner;
a plurality of word lines sequentially stacked on the second substrate;
a channel structure that intersects the plurality of word lines, on the second substrate; and
a bit line connected to the channel structure,
wherein the isolation contact is configured to have a voltage applied thereto.

17. The nonvolatile memory device of claim 16,
wherein the first substrate includes an element isolation trench that isolates the first circuit element and the second circuit element, and
wherein the insulating liner extends along a profile of the element isolation trench.

* * * * *